(12) United States Patent
Shin et al.

(10) Patent No.: US 7,629,215 B2
(45) Date of Patent: Dec. 8, 2009

(54) SEMICONDUCTOR DEVICE AND METHOD OF MANUFACTURING THE SAME

(75) Inventors: Soo-Ho Shin, Yongin-si (KR); Sun-Hoo Park, Yongin-si (KR); Byung-Hyug Roh, Yongin-si (KR); Young-Woong Son, Hwaseong-si (KR); Sang-Wook Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 33 days.

(21) Appl. No.: 12/128,682

(22) Filed: May 29, 2008

(65) Prior Publication Data
US 2008/0296637 A1 Dec. 4, 2008

(30) Foreign Application Priority Data
Jun. 1, 2007 (KR) ...................... 10-2007-0054012

(51) Int. Cl.
*H01L 21/8238* (2006.01)
*H01L 31/062* (2006.01)
(52) U.S. Cl. ...................... 438/230; 257/336
(58) Field of Classification Search ................. 438/184, 438/230, 303, 199; 257/194, 336, E21.626, 257/E21.064
See application file for complete search history.

(56) References Cited

U.S. PATENT DOCUMENTS

| 6,825,529 B2* | 11/2004 | Chidambarrao et al. ...... 257/336 |
| 7,445,978 B2* | 11/2008 | Teh et al. ..................... 438/199 |
| 2005/0112817 A1* | 5/2005 | Cheng et al. ................. 438/219 |

FOREIGN PATENT DOCUMENTS

| KR | 1020030000652 | * | 1/2003 |
| KR | 1020030000652 A | | 1/2003 |
| KR | 1020040049121 A | | 6/2004 |
| KR | 1020070002326 A | | 1/2007 |

* cited by examiner

*Primary Examiner*—Calvin Lee
(74) *Attorney, Agent, or Firm*—Volentine & Whitt, PLLC

(57) ABSTRACT

A semiconductor device includes first gate structures, second gate structures, a first capping layer pattern, a second capping layer pattern, first spacers, second spacers, third spacers, and a substrate having first impurity regions and second impurity regions. The first gate structures are arranged on the substrate at a first pitch. The second gate structures are arranged on the substrate at a second pitch greater than the first pitch. The first capping layer pattern has segments extending along side faces of the first gate structures and segments extending along the substrate. The second capping layer pattern has segments extending along the second gate structures and segments extending along the substrate. The first spacers and the second spacers are stacked on the second capping layer pattern. The third spacers are formed on the first capping layer pattern.

25 Claims, 18 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and to a method of manufacturing the same. More particularly, the present invention relates to a semiconductor device including transistors that have different sizes, and to a method of manufacturing the semiconductor device.

2. Description of the Related Art

Nowadays, electronics, e.g., equipment such as a personal computer, is being developed to perform a greater number of functions, to occupy less space and to operate at higher speeds. Semiconductor memory devices are used to store information in such electronics. Thus, semiconductor memory devices are being required to operate at higher speeds and to possess greater storage capacities. Accordingly, semiconductor memory devices along with their methods of manufacture are being developed with an aim towards improving the degrees of integration, reliability, response times, etc. of the devices.

One basic unit of a semiconductor memory device is a metal-oxide-semiconductor field-effect transistor (MOSFET). A MOSFET typically operates at a high speed under a relatively low voltage. Therefore, MOSFETs are being constantly refined so that they can become more highly integrated.

Highly integrated transistors are provided in what is referred to as a cell region of a semiconductor memory device. Transistors may also be provided in a core/peripheral region of a semiconductor memory device where circuits for driving the transistors in the cell region (hereinafter "cell transistors") are formed. The widths of the gates and the spacing between the gates of these core/peripheral transistors are greater than those of the cell transistors. Thus, source/drain regions in a semiconductor substrate at both sides of a gate electrode of a cell transistor tend to be very narrow.

The narrower the source/drain regions are, the smaller is the area (hereinafter "contact area") at which electrical contact can be established with a source/drain region. Thus, narrow source/drain regions are prone to contact failures. Furthermore, the contact resistance is high when the contact area is small. Consequently, transistors having small contact areas may also have poor operating characteristics.

To provide a sufficiently large contact area, spacers on sidewalls of the gate structure are conventionally made as thin as possible. However, when the spacers are too thin, impurities in the source/drain regions may diffuse into the semiconductor substrate under the gate structures. This reduces the channel length of the transistor. When the channel length is too short, the discharge in the drain region may be greater than the discharge by the gate structure. This undesired effect, in which the transistor does not perform a switching function, is referred to as a short channel effect.

SUMMARY OF THE INVENTION

An object of the present invention is to provide a reliable semiconductor device including transistors that have different sizes and different electrical characteristics.

An object of the present invention is to provide a semiconductor device including transistors that have different sizes and different electrical characteristics, and which device has excellent operating characteristics.

Other objects of the present invention are to provide methods by which such semiconductor devices may be readily manufactured.

A semiconductor device in accordance with one aspect of the present invention includes first gate structures, second gate structures, a first capping layer pattern, a second capping layer pattern, first spacers, second spacers, third spacers, and a substrate having first impurity regions and second impurity regions. The first gate structures are arrayed on a first region of the substrate at a first pitch. The second gate structures are arrayed on a second region of the substrate at a second pitch greater than the first pitch. The first capping layer pattern extends along side faces of the first gate structures and along the upper surface of the substrate. The second capping layer pattern extends along side faces of the second gate structures and along the upper surface of the substrate. The first spacers and the second spacers are stacked on the second capping layer pattern. The first spacers include a first insulation material and the second spacers include a second insulation material. The third spacers include the second insulation material and are arranged on the first capping layer pattern. The first impurity regions are formed in the substrate at both sides of the first gate structures. The second impurity regions are formed in the substrate at both sides of the second gate structures.

In a method of manufacturing a semiconductor device in accordance with another aspect of the present invention, first gate structures are formed on a first region of a substrate at a first pitch. Second gate structures are formed on a second region of the substrate at a second pitch greater than the first pitch. A capping layer is formed on the first gate structures, the second gate structures and the substrate. First spacers and second spacers are sequentially formed on the side faces of the second gate structures. Also, the first spacer includes a first insulation material and the second spacer includes a second insulation material. The third spacer includes the second insulation material and is formed on the side faces of the first gate structures. The capping layer is etched to form a first capping layer pattern on the side faces of the first gate structures and a second capping layer pattern on the side faces of the second gate structures. First impurity regions are formed in the substrate at both sides of the first gate structures. Second impurity regions are formed in the substrate at both sides of the second gate structures.

According to the present invention, the sidewall spacers on the gate structures have different thicknesses corresponding to the pitch of the gate structures. That is, the sidewall spacers have different thicknesses in different regions of a substrate. Thus, the gate structures of some of the transistors may have a narrow pitch and therefore, those transistors have low contact resistance where electrical contact is established with source/drain regions. Furthermore, the gate structures of other transistors may have a wider pitch and so, these transistors are not likely to suffer from short channel effects. As a result, the semiconductor device has excellent electrical characteristics and reliability.

BRIEF DESCRIPTION OF THE DRAWINGS

The above and other objects, features and advantages of the present invention will become more apparent by referring to the following detailed description of the preferred embodiments thereof, made in conjunction with the accompanying drawings, wherein.

DETAILED DESCRIPTION OF THE EMBODIMENTS

Figure 1:
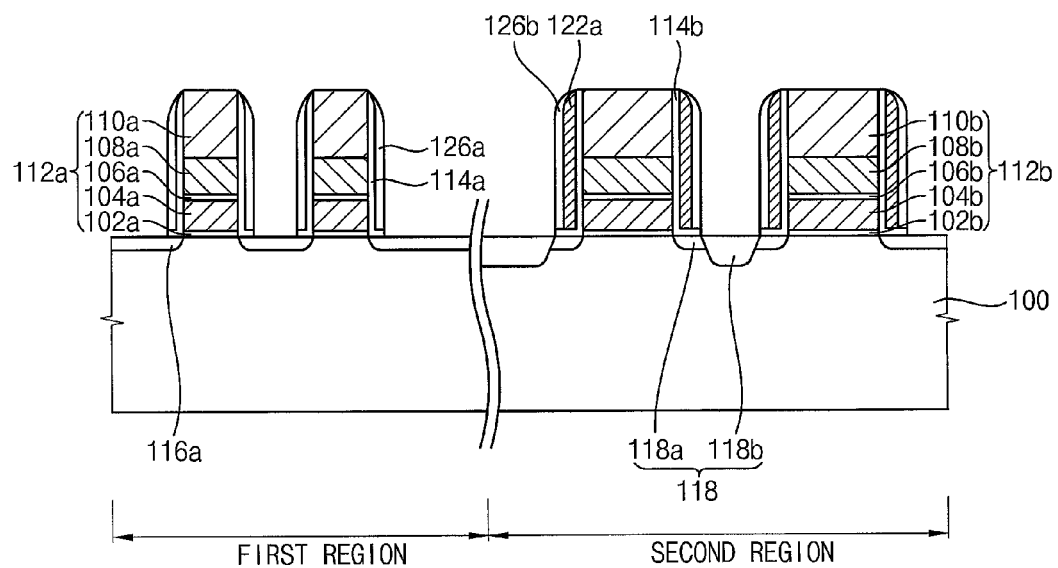
FIG. 1 is a cross-sectional view of a first embodiment of a semiconductor device in accordance with the present invention.

The present invention will be described below in more detail with reference to the accompanying drawings. It is to be noted, though, that the dimensions of layers and regions are exaggerated in the drawings for clarity of illustration. Also, like reference numerals designate like elements throughout the drawings.

Furthermore, when an element or layer is referred to in the written description as being arranged 'on' another element or layer, it means that such an element or layer can be either directly on the other element or layer, or that intervening elements or layers may be present therebetween. Also, when an element or layer is referred to as being 'under' or 'over' another layer or element, it means either that the element or layer can be directly under or over the other element or layer, or that one or more other elements or layers may be present therebetween.

Referring now to FIG. 1, a semiconductor device according to the present includes a substrate 100, e.g., a silicon substrate, having a first region and a second region. The first region may be a cell region where cell transistors of a semiconductor memory device are arranged. The second region may be a core/peripheral region where circuits for driving the cell transistors of the semiconductor memory device are arranged.

The cell transistors have first gate structures 112a, respectively. The first gate structures 112a are arranged in parallel. Furthermore, the first gate structures 112a are spaced regularly apart from each other by a first interval and have the same widths. Also, in this embodiment, the first gate structures 112a each include a metal conductive element. In particular, the first gate structures 112a include a gate oxide layer pattern 102a, a polysilicon layer pattern 104a, a metal barrier layer pattern 106a, a metal layer pattern 108a and a hard mask pattern 110a. The gate oxide layer pattern 102a, the metal layer pattern 108a and the metal barrier layer pattern 106a may be of silicon oxide, tungsten and tungsten nitride, respectively.

The peripheral transistors, constituting peripheral circuits of the semiconductor memory device, have second gate structures 112b, respectively. The second gate structures 112b are arranged in parallel and all have the same width. Furthermore, the second gate structures 112b are spaced regularly apart from each other by a second interval greater than the first interval. Also the second gate structures 112b are wider than the first gate structures 112a. In this embodiment, each of the second gate structures 112b includes elements which are substantially the same as those of each of the first gate structures 112a. However, the present invention is not so limited. That is, the elements which make up each of the second gate structures 112b may be different from those which make up each of the first gate structures 112a. Also, the peripheral transistors may have an operating voltage and an operating speed greater than those of the cell transistors. Accordingly, the peripheral transistors may be larger than the cell transistors.

A first capping layer pattern 114a extends along side faces of the first gate structures 112a and an upper surface of the substrate 100 and lies in contact with the side faces of the first gate structures 112a. Thus, the first capping layer pattern 114a has a bent portion at each interface between a side face of a first gate structure 112a and the substrate 100. The first capping layer pattern 114a protects the first gate structures 112a by preventing the metal of the first gate structures 112a from oxidizing. Furthermore, the first capping layer pattern 114a may prevent impurities from diffusing laterally in the substrate during a light doping process. The first capping layer pattern 114a may include a layer of silicon nitride or silicon oxynitride.

The first capping layer pattern 114a has a thickness of about 30 Å to 100 Å. When the thickness of the first capping layer pattern 114a were below about 30 Å, the first capping layer pattern 114a might not prevent the oxidizing of the metal of the first gate structures 112a. On the other hand, when the thickness of the first capping layer pattern 114a were above about 100 Å, the spacing between the first gate structures 112a would become too narrow to facilitate further processing of the substrate at the first region.

A second capping layer pattern 114b extends along the side faces of the second gate structures 112b and an upper surface of the substrate 100 and lies in contact with the side faces of the second gate structures 112b. Thus, the second capping layer pattern 114b has a bent portion at each interface between a side face of a second gate structure 112b and the substrate 100. In this embodiment, the thickness and material of the second capping layer pattern 114b are substantially the same as those of the first capping layer pattern 114a.

A first spacer 122a is arranged on the second capping layer pattern 114b. The first spacer 122a includes an electrical insulator (referred to hereinafter as "insulation material"). Furthermore, the insulation material may have an etch selectivity with respect to the material of the second capping layer pattern 114b. For example, the insulation material may be a middle temperature oxide (MTO) layer such as a layer of silicon oxide.

The first spacer 122a partially covers that segment of the second capping layer pattern 114b which extends along the upper surface of the substrate 100. Furthermore, the first spacer 122a does not have bent portions at the interfaces between the side faces of the second gate structures 112b and the upper surface of the substrate 100.

A second spacer 126b extends over the first spacer 122a. The second spacer 126b is of a second insulation material different from the insulation material of the first spacer 126a. The bottom of the second spacer 126b contacts the end of that segment of the second capping layer pattern 114b which extends along the upper surface of the substrate 100.

The second spacer 126b may serve to protect the second gate structures 112b while a self-aligned contact hole is formed (as will be described later on). Thus, the second insulation material preferably has an etch selectivity with respect to silicon oxide. For example, the second spacer 126b may be a layer of silicon nitride or silicon oxynitride. Alternatively, the second spacer 126b may serve to control the distance over which impurities diffuse laterally in the substrate during a doping process (as will also be described later on). In this case, the second spacer 126b may be a layer of silicon oxide.

A third spacer 126a is arranged on the first capping layer pattern 114a. The third spacer 126a may be of the same (insulation) material as the second spacer 126b. Furthermore, the third spacer 126a may have a thickness substantially the same as that of the second spacer 126b.

The substrate 100 also includes a first impurity region 116a between the first gate structures 112a, and a second impurity region 118 between the second gate structures 112b. The second impurity region 118 includes a lightly doped impurity region 118a and a heavily doped impurity region 118b at the sides of the second lightly doped impurity region 118a.

In this embodiment, the first impurity region 116a and the second impurity region 118 have different impurity concentrations and different depths. In the case in which the peripheral transistors have an operating voltage greater than that of the cell transistors, e.g., in the case in which the peripheral transistors drive the cell transistors, the impurity concentration and the depth of the second impurity region 118 are greater than those of the first impurity region 116a.

FIGS. 2 to 9 illustrate a method of manufacturing the semiconductor device shown in FIG. 1.

Figure 2:
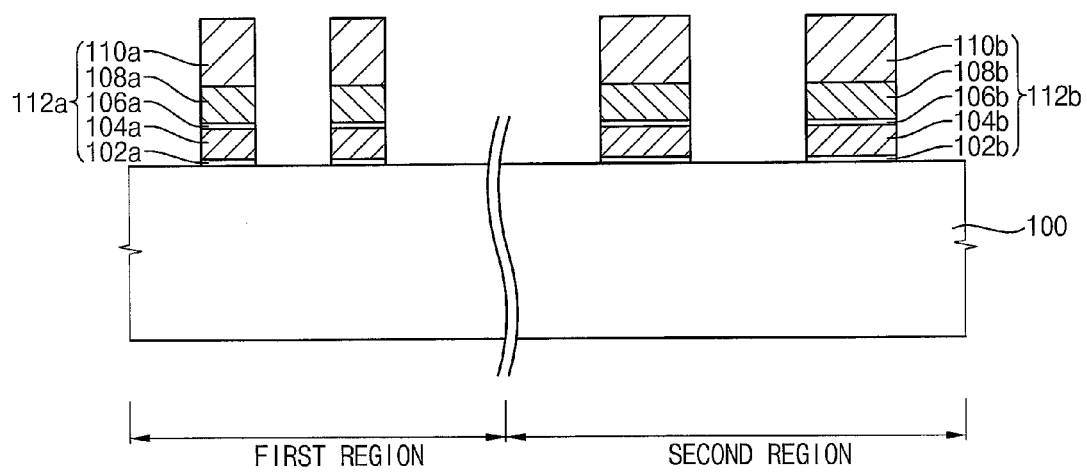
FIGS. 2 to 9 are cross-sectional views illustrating a method of manufacturing the semiconductor device shown in FIG. 1.

Referring to FIG. 2, a gate oxide layer (not shown), a gate conductive layer (not shown) and a hard mask layer (not shown) are sequentially formed on silicon substrate 100. In this embodiment, the gate oxide layer is formed by thermally oxidizing the substrate 100. Thus, the gate oxide layer is a silicon oxide layer. The gate conductive layer may be a laminate including a polysilicon layer doped with impurities, a metal barrier layer and a metal layer sequentially arranged one atop the other. The hard mask layer is a silicon nitride layer.

The hard mask layer is then patterned using a photolithographic process to form a hard mask pattern 110a on the first region of the substrate and a hard mask pattern 110b on the second region of the substrate. The patterning is carried out such that the widths and spacing of the features of the hard mask pattern 110a on the first region of the substrate are different than those of the hard mask pattern 110b on the second region of the substrate. Specifically, the features of the hard mask pattern 110a on the first region have the same width, the features of the hard mask pattern 110b on the second region have the same width, and the features of the hard mask pattern 110b on the second region are wider than the features of the hard mask pattern 110a on the first region. Furthermore, the features of the hard mask pattern 110a are spaced regularly apart on the first region, the features of the hard mask pattern 110b are spaced regularly apart on the second region, and the spacing of the features of the hard mask pattern 110b on the second region is greater than the spacing of the features of the hard mask pattern 110a on the first region.

The gate conductive layer and the gate oxide layer are etched using the hard mask patterns 110a and 110b as an etching mask to form the first gate structures 112a in the first region and the second gate structures 112b in the second region. In this embodiment, the first gate structures 112a and the second gate structures 112b may include a gate oxide layer pattern 102a and 102b, a polysilicon layer pattern 104a and 104b, a metal barrier layer pattern 106a and 106b, a metal layer pattern 108a and 108b and a hard mask pattern 110a and 110b, respectively. The metal layer pattern 108a and 108b and the metal barrier layer pattern 106a and 106b may include tungsten and tungsten nitride, respectively.

Figure 3:
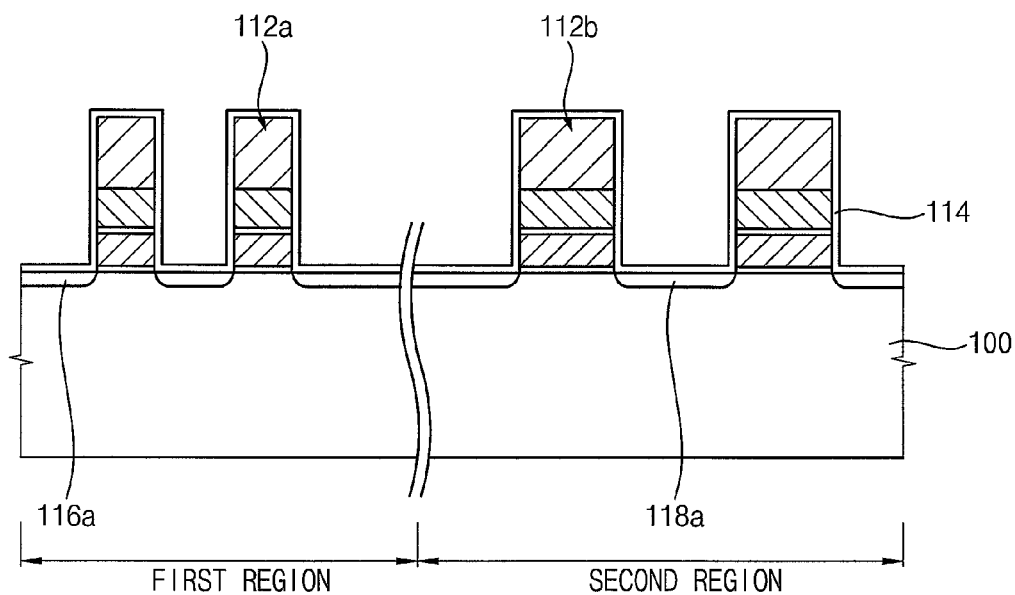

Referring to FIG. 3, a capping layer 114 having a thickness of about 50 Å to about 100 Å is formed on the substrate 100, the first gate structures 112a and the second gate structures 112b. In this embodiment, the capping layer 114 is a layer of silicon nitride formed by a chemical vapor deposition (CVD) process. The capping layer 114 prevents the tungsten in the first gate structures 112a and the second gate structures 112b from oxidizing. Furthermore, the capping layer 114 prevents impurities from diffusing excessively in a lateral direction during a light doping process (described below).

Next, impurities are lightly implanted into the substrate 100 to form the first impurity region 116a in the substrate 100 between the first gate structures 112a, and the second lightly doped impurity region 118a in the substrate 100 between the second gate structures 112b.

Figure 4:
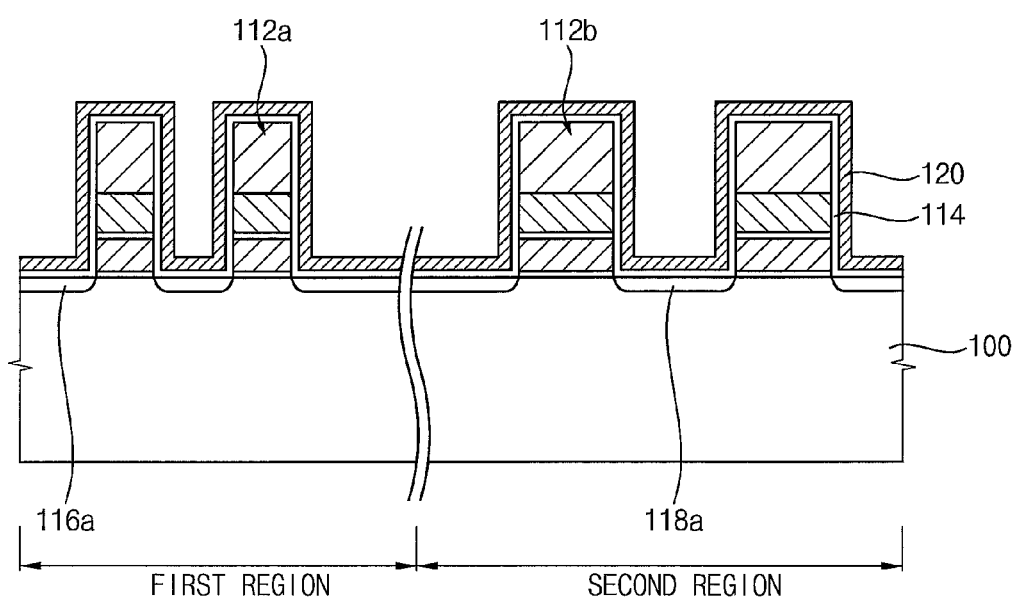

Referring to FIG. 4, a first insulation layer 120 is formed on the capping layer 114. In this embodiment, the first insulation layer 120 is of a first insulation material having an etch selectivity with respect to the capping layer 114. For example, the first insulation layer 120 is a middle temperature oxide formed by CVD.

The first insulation layer 120 may be used to control of the extent to which impurities diffuse laterally in the second region of the substrate 100 when a heavily doped impurity region is subsequently formed between the second gate structures 112b. That is, forming a relatively thick first insulation layer 120 prevents the impurities from readily diffusing under the second gate structures 112b. Thus, a relatively great channel length may be realized. On the other hand, forming a relatively thin first insulation layer 120 allows the impurities to readily diffuse under the second gate structures 112b. Thus, the channel length of the peripheral transistors will be relatively small.

Figure 5:
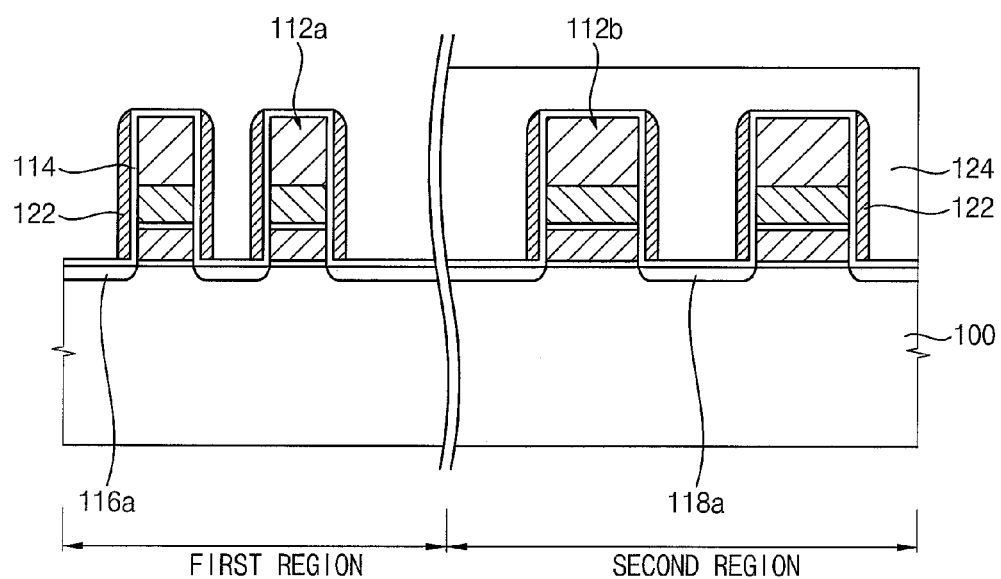

Referring to FIG. 5, the first insulation layer 120 is anisotropically etched until the substrate 100 between the first gate structures 112a and the second gate structures 112b and a portion of the capping layer 114 on upper surfaces of the first gate structures 112a and the second gate structures 112b are exposed. As a result, first preliminary spacers 122 are formed on side faces of the first gate structures 112a and the second gate structures 112b, respectively.

Next, a photoresist film (not shown) is formed over the first gate structures 112a and the second gate structures 112b. The photoresist film is exposed, developed and baked to form a first photoresist pattern 124 having an opening over the first region of the substrate.

Figure 6:
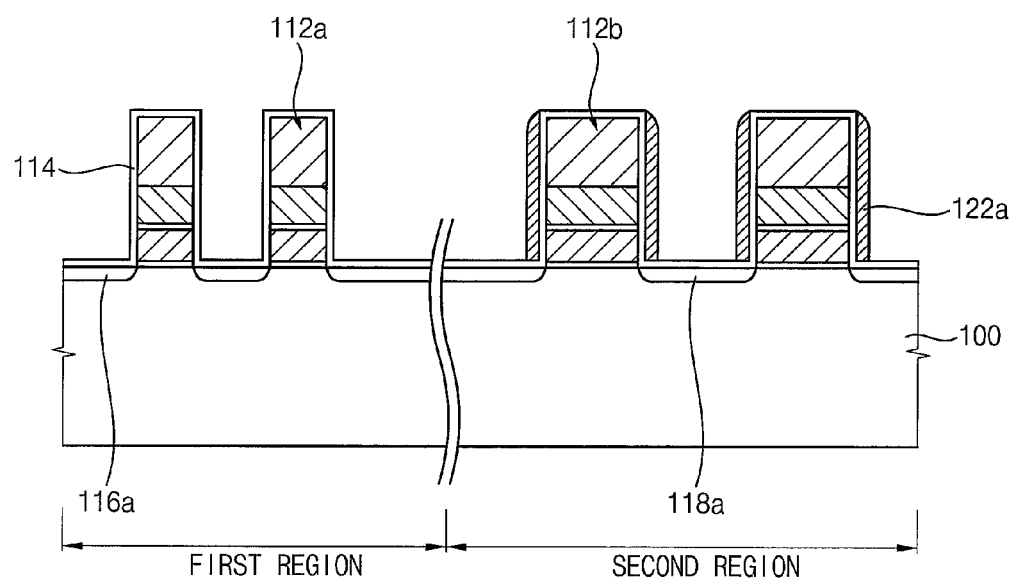

Referring to FIG. 6, the first preliminary spacers 122 on the first region are removed using the first photoresist pattern 124 as an etching mask to form the first spacers 122a on the side faces of the second gate structures 112b. In this respect, the first preliminary spacers 122 on the first region may be removed by an isotropic etching process such as a wet etching process or a chemical dry etching process. The first photoresist pattern 124 is then removed by an ashing process and/or a stripping process.

Figure 7:
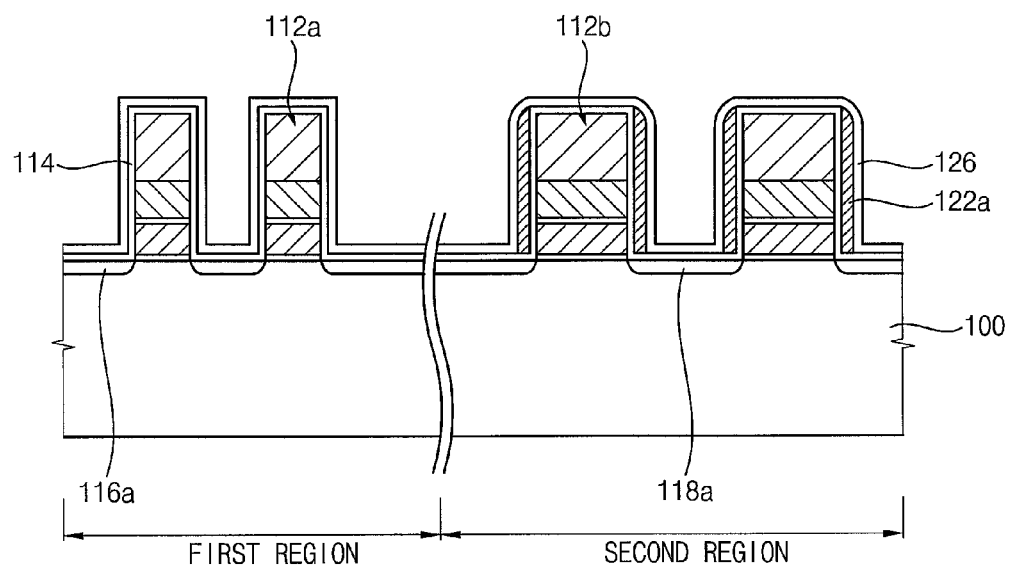

Referring to FIG. 7, a second insulation layer 126 is formed on the capping layer 114 and the first spacers 122a.

The second insulation layer 126 may be used to control the extent to which impurities diffuse laterally in the substrate 100 under the first gate structures 112a and the second gate structures 112b when a heavily doped impurity region is subsequently formed between the first gate structures 112a and the second gate structures 112b. Furthermore, the second insulation layer 126 may prevent the first gate structures 112a and the second gate structures 112b from being exposed when a self-aligned contact hole is subsequently formed. Thus, the second insulation layer 126 may include a material having an etch selectivity with respect to silicon oxide. In this embodiment, the second insulation layer 126 includes a layer of silicon nitride or a layer of silicon oxynitride.

Preferably, the second insulation layer 126 is formed to a thickness of about 30 Å-100 Å. When the thickness of the second insulation layer 126 is below about 30 Å, the second insulation layer 126 might not sufficiently limit the extent to which impurities diffuse laterally in the substrate 100 under the first gate structures 112a and the second gate structures 112b. Furthermore, such a thin layer might not prevent the first gate structures 112a and the second gate structures 112b from being exposed and hence, from being damaged, while a self-aligned contact hole is being formed between adjacent ones of the gate structures. On the other hand, when the thickness of the second insulation layer 126 is above about 100 Å, the interval between adjacent ones of the first gate structures 112a could be too narrow.

Figure 8:
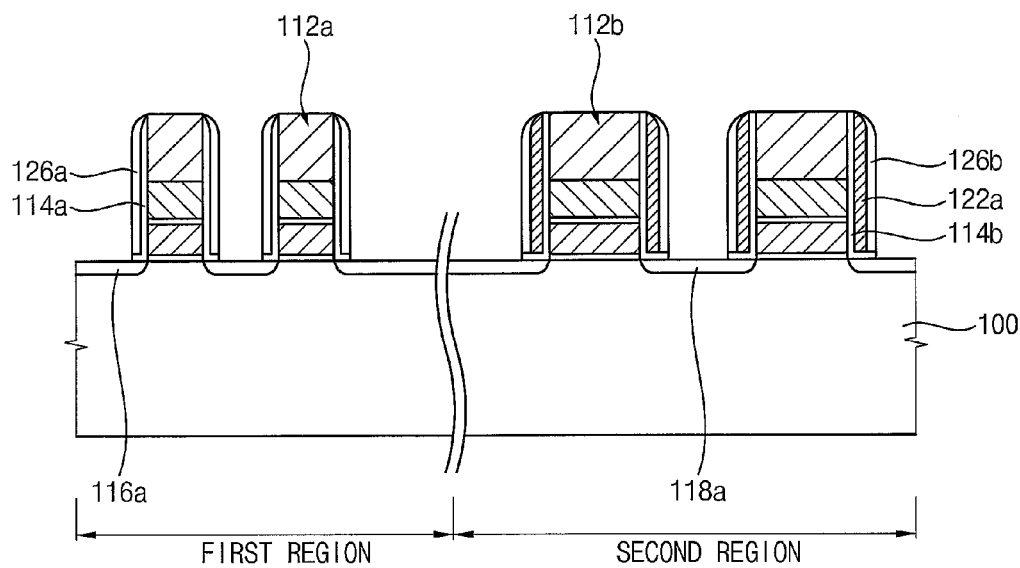

Referring to FIG. 8, the second insulation layer 126 is anisotropically etched until the substrate 100 between the first gate structures 112a and the second gate structures 112b and a portion of the capping layer 114 on upper surfaces of the first gate structures 112a and the second gate structures 112b are exposed. As a result, second spacers 126b are formed on the first spacers 122a on side faces of the second gate structures 112b, and third spacers 126a are formed on the side faces of the first gate structures 112a.

The capping layer 114 is anisotropically etched to remove those portions of the capping layer 114 which extend along the substrate 100 between the second spacers 126b and the third spacers 126a and along the upper surfaces of the first gate structures 112a and the second gate structures 112b. As a result, a first capping layer pattern 114a is formed on the first gate structures 112a and a second capping layer pattern 114b is formed on the second gate structures 112b.

The first capping layer pattern 114a has a bent portion at each interface between a side face of a first gate structure 112a and the substrate 100. Furthermore, the second capping layer pattern 114b has a bent portion at each interface between a side face of a second gate structure 112b and the substrate 100. The bottom of the second spacer 126 contacts the end of that segment of the second capping layer pattern 114b which extends along the substrate 100.

Figure 9:
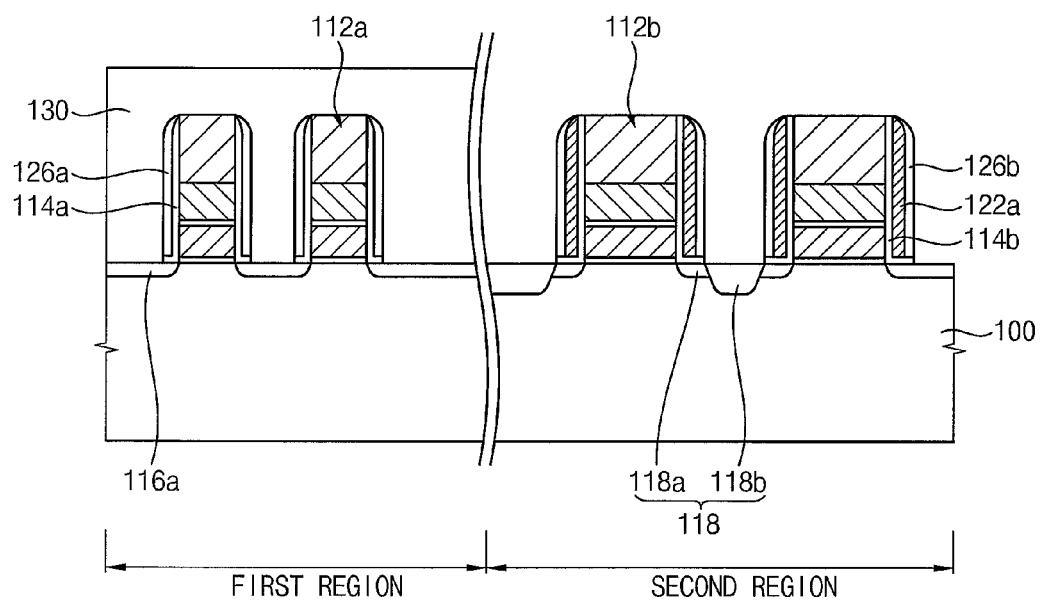

Referring to FIG. 9, a photoresist film (not shown) is formed over the first gate structures 112a and the second gate structures 112b. The photoresist film is exposed, developed and baked to form a second photoresist pattern 130 that exposes the first region.

Impurities are implanted into the second region using the second photoresist pattern 130 as an ion implantation mask to form the second heavily doped impurity region 118b. As a result, the second impurity region 118 includes the second lightly doped impurity region 118a and the second heavily doped impurity region 118b. In this embodiment, the doping is carried out so that the concentration of impurities in the second impurity region 118 is higher than that of the impurities in the first impurity region 116a. Furthermore, the depth to which impurities are implanted in the second region of the substrate to form the second impurity region 118 is greater than the depth to which impurities are implanted in the first region of the substrate to form the first impurity region 116a.

Figure 10:
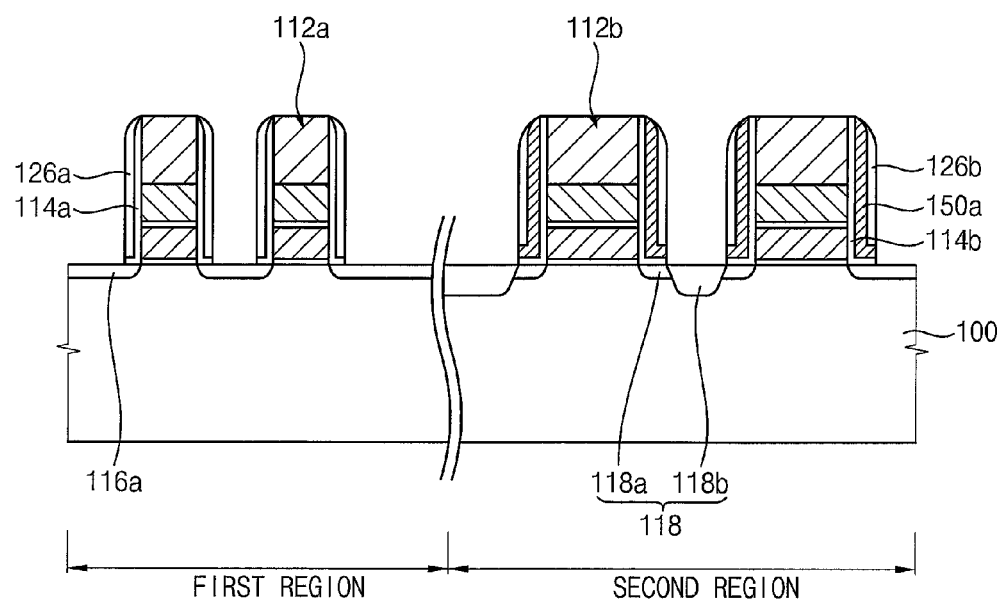
FIG. 10 is a cross-sectional view of a second embodiment of a semiconductor device in accordance with the present invention.

The second photoresist pattern 130 is then removed (FIG. 10). Although not illustrated in the drawings, a heavily doped impurity region may be additionally formed in the first region of the substrate 100 before or after the second heavily doped impurity region 118b is formed.

According to the present invention as described above, only the third spacers are formed on the side faces of the gate structures of the transistors on the first region of the substrate. Thus, the transistors on the first region may have relatively thin sidewall spacers. Therefore, the transistors on the first region may have relatively large contact areas where the source/drain regions are formed. As a result, the transistors on the first region may have minimal contact resistance. In contrast, the first spacers and the second spacers are formed on each of the side faces of the gate structures of the transistors on the second region. Thus, the transistors on the second region have relatively thick sidewall spacers. Therefore, the impurities will not excessively diffuse under the gate structures. As a result, the transistors on the second region will not experience short channel effects.

FIG. 10 illustrates a second embodiment of a semiconductor device according to the present invention. The second embodiment of the semiconductor device is substantially the same as the above-described first embodiment with the exception of the first spacers. Thus, the description of the aspects of the second embodiment which are similar to those of the first embodiment will be described only briefly.

Referring to FIG. 10, cell transistors occupy the first region of the substrate 100, and peripheral transistors occupy the second region of the substrate 100. More specifically, first gate structures 112a of the cell transistors are arranged on the first region of the substrate 100. The first capping layer pattern 114a is arranged on the side faces of the first gate structures 112a and the upper surface of the substrate 100 and lies in contact with the side faces of the first gate structures 112a. The third spacers 126a extend over the first capping layer pattern 114a. The second gate structures 112b of the peripheral transistors are arranged on the second region of the substrate 100. The second capping layer pattern 114b is arranged on the side faces of the second gate structures 112b and the upper surface of the substrate 100 and lies in contact with the side faces of the second gate structures 112b. Thus, the second capping layer pattern 114b has a bent portion adjacent to each interface between a side face of a second gate structure 112b and the substrate 100.

A first spacer 150a extends over the second capping layer pattern 114b so as to be arranged on the side faces of the second gate structures 112b. The first spacer 150a is of a first insulation material having an etch selectivity with respect to the second capping layer pattern 114b. In this embodiment, the first insulation material is a middle temperature oxide such as silicon oxide.

The first spacer 150a covers the second capping layer pattern 114b completely. Furthermore, the first spacer 150a has a bent portion adjacent to each interface between a side face of a second gate structure 112b and the upper surface of the substrate 100.

The second spacer 126b is arranged on the first spacer 150a. The second spacer 126b may be of an insulation material comprising silicon nitride, silicon oxynitride, or silicon oxide. The bottom of the second spacer 126b rests on that segment of the first spacer 150a which extends laterally from the bend in the first spacer 150a.

The first impurity region 116a of the substrate 100 extends between the first gate structures 112a. The second impurity region 118 of the substrate 100 extends between the second gate structures 112b.

Figure 11:
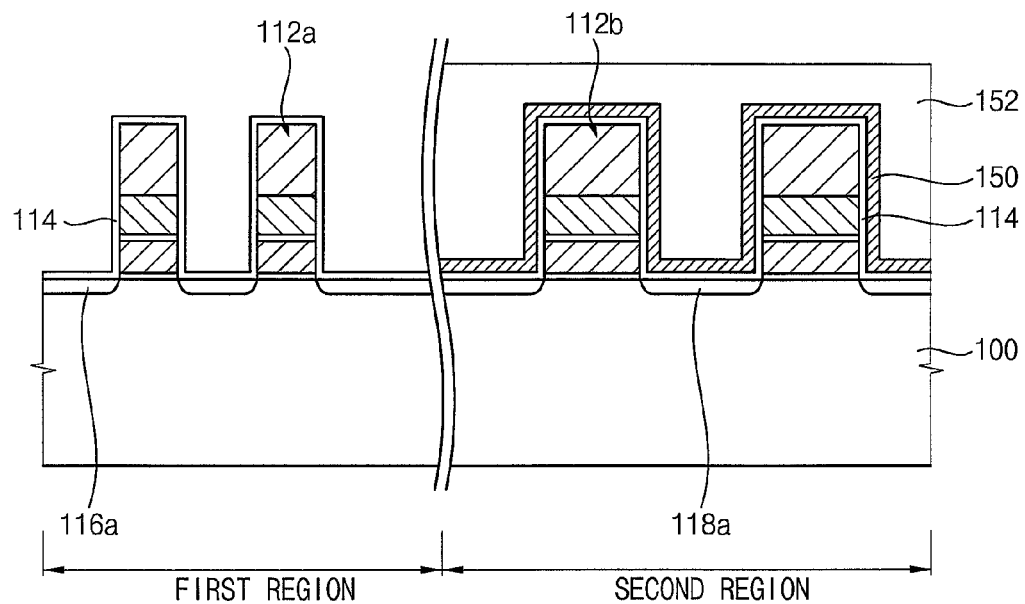
FIGS. 11 to 13 are cross-sectional views illustrating a method of manufacturing the semiconductor device shown in FIG. 10.
Figure 12:
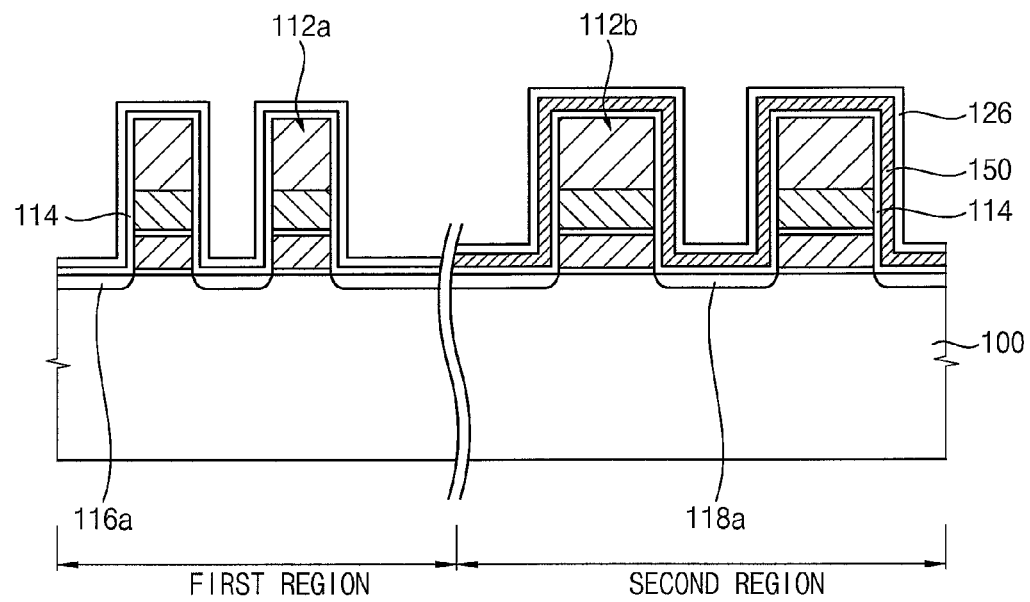
Figure 13:
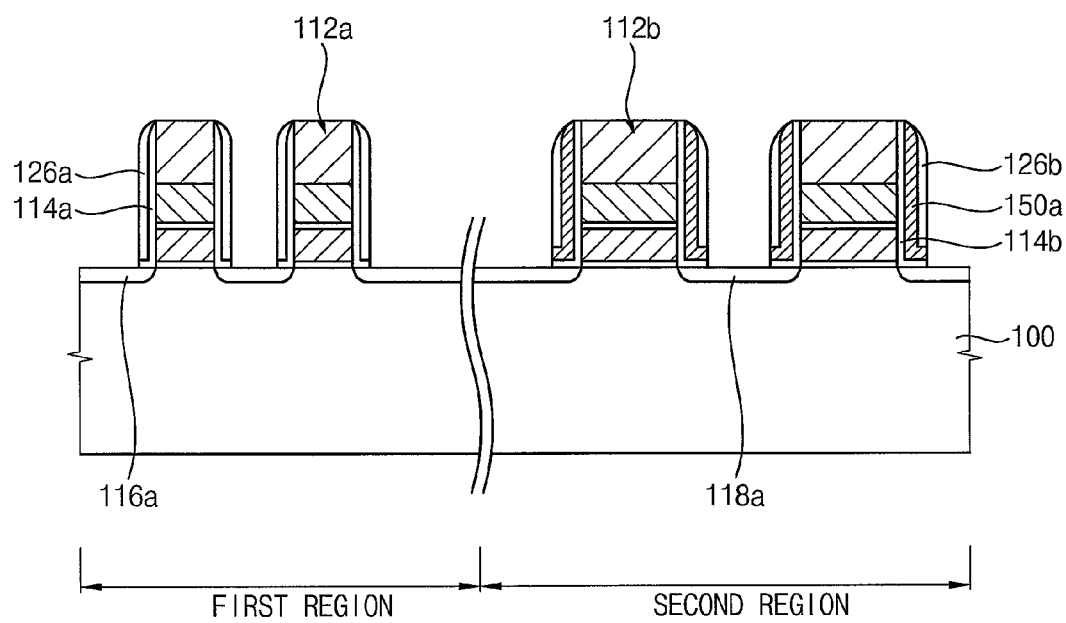

FIGS. 11 to 13 illustrate a method of manufacturing the semiconductor device shown in FIG. 10.

The processes of manufacturing the semiconductor device shown in FIG. 10 are substantially the same as those of manufacturing the first embodiment of the semiconductor device shown 1 except for a process of forming a spacer. Thus, these processes will not be described or illustrated again for brevity.

First, the first gate structures 112a, the second gate structures 112b, the capping layer 114 and the first insulation layer 120 are formed by processes substantially the same as those illustrated in and described with reference to FIGS. 2 to 4.

Referring to FIG. 11, a photoresist film (not shown) is formed over the first gate structures 112a and the second gate structures 112b. The photoresist film is exposed, developed and baked to form a first photoresist pattern 152 having an opening that exposes the portion of the first insulation layer 120 extending over the first region of the substrate.

The exposed portion of the first insulation layer 120 is completely removed using the first photoresist pattern 152 as an etching mask to form a first insulation layer pattern 150. More specifically, the exposed portion of the first insulation layer 120 is removed by an isotropic etching process so that none of the first insulation layer 120 remains on the side faces of the first gate structures 112a. In this embodiment, the exposed portion of the first insulation layer 120 is removed by a wet etching process.

The first photoresist pattern 152 is then removed by an ashing process and/or a stripping process.

Referring to FIG. 12, a second insulation layer 126 is formed on the capping layer 114 and the first insulation layer pattern 150. The second insulation layer 126 serves to control of the extent to which impurities diffuse laterally in the substrate 100 under the first gate structures 112a and the second gate structures 112b when heavily doped impurity regions of the substrate 100 are formed between the first gate structures 112a and the second gate structures 112b.

Referring to FIG. 13, the second insulation layer 126 is anisotropically etched until the substrate 100 between the first gate structures 112a and the second gate structures 112b and a portion of the capping layer 114 on upper surfaces of the first gate structures 112a and the second gate structures 112b are exposed. As a result, the first spacers 150a and the second spacers 126b are formed on the side faces of the second gate structures 112b, and the third spacers 126a are formed on the side faces of the first gate structures 112a. In this case, each first spacer 150a has a bent portion adjacent to an interface between a side face of a second gate structure 112b and the upper surface of the substrate 100, as distinguished from the first spacer in the first embodiment.

The capping layer 114 is then anisotropically etched to remove those portions of the capping layer 114 extending on the substrate 100 between the second spacers 126b and the third spacers 126a and extending along the upper surfaces of the first gate structures 112a and the second gate structures 112b. Consequently, the first capping layer pattern 114a is formed on the first gate structures 112a and the second capping layer pattern 114b is formed on the second gate structures 112b.

The first capping layer pattern 114a has bent portions adjacent the interfaces between the side faces of the first gate structures 112a and the substrate 100. Furthermore, the second capping layer pattern 114b has bent portions adjacent the interface between the side faces of the second gate structures 112b and the substrate 100. The bottom of the first spacer 150a completely covers the segment of the second capping layer pattern 114b which extends along the upper surface of the substrate 100.

Next, the second impurity region 118 is formed by a process substantially the same as that illustrated in and described with reference to FIG. 9. That is, the impurities are implanted into the second region of the substrate 100 to form the second impurity region 118.

Figure 14:
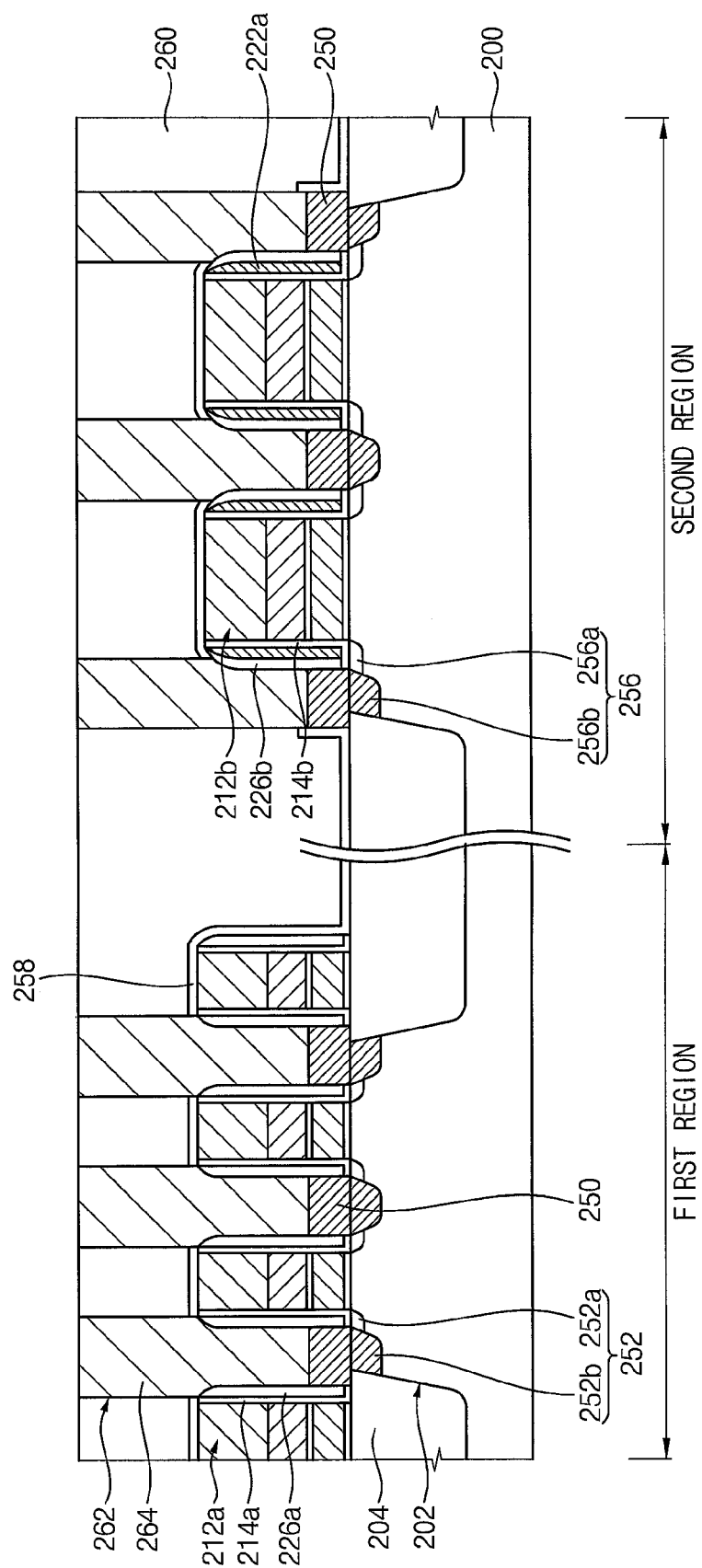
FIG. 14 is a cross-sectional view of a third embodiment of a semiconductor device in accordance with the present invention.

FIG. 14 illustrates a third example of a semiconductor device in accordance with the present invention.

Referring to FIG. 14, a substrate 200 has a first region and a second region. In this embodiment, the first region may be a cell region where cell transistors of a semiconductor memory device are formed. The second region may be a core/peripheral region where circuits for driving the cell transistors of the semiconductor memory device are formed.

The first region and the second region of the substrate 200 are divided into active regions and field regions by isolation layer pattern 204. In this embodiment, each of the active regions in the first region has an isolated island shape. Furthermore, the active regions may be arranged regularly across the first region of the substrate.

The cell transistors have first gate structures 212a arranged on the first region of the substrate. The first gate structures 212a extend linearly and parallel with each other in a direction substantially perpendicular to the lengthwise direction of the isolated active regions. Furthermore, the first gate structures 212a are spaced regularly apart from each other and have the same width.

The portions of the active region at both sides of the first gate structures 212a correspond to source/drain regions. As shown in FIG. 14, peripheral portions of source/drain regions contact the field regions in each cell.

In this embodiment, the first gate structures 212a each include a metal member. In particular, the first gate structures 212a include a gate oxide layer pattern, a polysilicon layer pattern, a metal barrier layer pattern, a metal layer pattern and a hard mask pattern. The gate oxide layer pattern, the metal layer pattern and the metal barrier layer pattern preferably include silicon oxide, tungsten and tungsten nitride, respectively.

Peripheral transistors, constituting peripheral circuits of the semiconductor memory device, have second gate structures 212b arranged on the second region of the substrate 200. The second gate structures 212b are extend parallel to each other and are spaced regularly apart from each other by an interval greater than that by which the first gate structures 221a are spaced. Each of the second gate structures 212b is also wider than the first gate structures 221a. Also, in this embodiment, the second gate structures 212b have substantially the same structure as the first gate structures 212a. However, the present invention is not so limited. Rather, the second gate structures 212b may include elements different from those of the first gate structures 212a A first capping layer pattern 214a is arranged on side faces of the first gate structures 212a and an upper surface of the substrate 200 and lies in contact with the side faces of the first gate structures 212a. The first capping layer pattern 214a has a bent portion adjacent to each interface between a side face of a first gate structure 212a and the substrate 200. That is, the first capping layer pattern 214a has a shape substantially the same as that of the first capping layer pattern in the previously described embodiments.

A second capping layer pattern 214b is arranged on side faces of the second gate structures 212b and an upper surface of the substrate 200 and lies in contact with the side faces of the second gate structures 212b. The second capping layer pattern 214b has a bent portion adjacent to each interface between a side face of the second gate structure 212b and the substrate 200. In this embodiment, the second capping layer pattern 214b has a thickness and is of material substantially the same as those of the first capping layer pattern 214a.

First spacers 222a are arranged on the second capping layer pattern 214b and extend over the side faces of the second gate structures 212b, respectively. The first spacers 222a include a first insulation material. Furthermore, the first spacers 222a do not have bent portions adjacent to the interfaces between the side faces of the second gate structures 212b and the upper surface of the substrate 200.

A respective second spacer 226b is arranged on each first spacer 222a. The second spacer 226b may include an insulation material different from that of the first spacer 22a. Also, the bottom of the second spacer 226b contacts the end of the segment of the second capping layer pattern 214b which extends along the upper surface of the substrate 200.

Third spacers 226a are arranged on the first capping layer pattern 214a so as to extend over the side faces of the first gate structures 212a, respectively. The third spacers 226a may include the same insulation material as the second spacers 226b.

That is, the shapes of first spacers 222a, the second spacers 226b and the third spacers 226a may be substantially the same as those of the first spacers, the second spacers and the third spacers, respectively, of the first embodiment.

A doped single crystalline silicon layer pattern 250 is arranged on the substrate between the first gate structures 212a and between the second gate structures 212b in the active regions, respectively, and on portions of the upper surface of the isolation layer pattern 204. That is, portions of the single crystalline silicon layer pattern 250 extend from the active regions, in each of the first and second regions of the substrate, and onto part of the upper surface of the isolation layer pattern 204. Thus, the discrete upper surfaces of the single crystalline silicon layer pattern 250 have larger areas than the areas of the active regions, respectively. Also, the portions of the single crystalline silicon layer pattern 250 on the sides of the gate patterns in each active region, i.e., in a region isolated by the isolation layer pattern 204, do not contact each other.

The first region of the substrate 200 has first impurity regions 252 extending to both sides of each of the first gate structures 212a. Furthermore, the first impurity regions 252 serve as source/drain regions of the cell transistors. The first impurity region 252 may include a first lightly doped impurity region 252a and a first heavily doped impurity region 252b. In this case, each first lightly doped impurity region 252a occupies a portion of the substrate 200 adjacent a first gate structure 212a. Furthermore, each first heavily doped impurity region 252b extends from an end of a first lightly doped impurity region 252a to the upper surface of the single crystalline silicon layer pattern 250.

The second region substrate 200 also has second impurity regions 256 under the single crystalline silicon layer pattern 250 and extending to both sides of each of the second gate structures 212b. The second impurity regions 256 serve as source/drain regions of the peripheral transistors. The second impurity region 256 may include a second lightly doped impurity region 256a and a second heavily doped impurity region 256b. In this case, each second lightly doped impurity region 256a occupies a portion of the substrate 200 adjacent to a second gate structure 212b. Furthermore, each second heavily doped impurity region 256b extends between a second lightly doped impurity region 256a and an upper surface of the single crystalline silicon layer pattern 250. In this embodiment, the concentration of the impurities in and the depth of the first impurity regions 252 are different from those of the second impurity regions 256.

An etch-stop layer 258 is arranged on the first gate structures 212a, the second gate structures 212b and the single crystalline silicon layer pattern 250. The etch-stop layer 258 acts to prevent the upper surface of the single crystalline layer pattern 250 from being damaged while a self-aligned contact hole is being formed. In this embodiment, the etch-stop layer 258 includes silicon nitride.

An insulation interlayer 260 is arranged on the substrate 200 so as to occupy interstices between the first gate structures 212a and between the second gate structures 212b. In this embodiment, the insulation interlayer 260 includes silicon oxide.

Contact plugs 264 extend through the insulation interlayer 260. The contact plugs 256 are electrically conductively connected to the first impurity regions 252 and the second impurity regions 256. That is, a lower surface of each contact plug 264 contacts the single crystalline silicon layer pattern 250, not the upper surface of the substrate 200, in the active region. Thus, respective ones of the contact plugs 264 have a relatively large contact area. As a result, these contact plugs 264 have a correspondingly small contact resistance. Furthermore, the source/drain regions are in effect expanded to the upper surface of the single crystalline silicon layer pattern 250. Thus, impurities will not diffuse excessively in the substrate, i.e., will not diffuse under the gate structures. As a result, the transistors will not experience short channel effects.

FIGS. 15 to 23 illustrate a method of manufacturing the semiconductor device shown in FIG. 14. The method includes processes substantially the same as those of the first embodiment of the method of the manufacturing the semiconductor device with the exception of processes for forming a single crystalline silicon layer pattern and forming impurity regions in the single crystalline silicon layer pattern.

Figure 15:
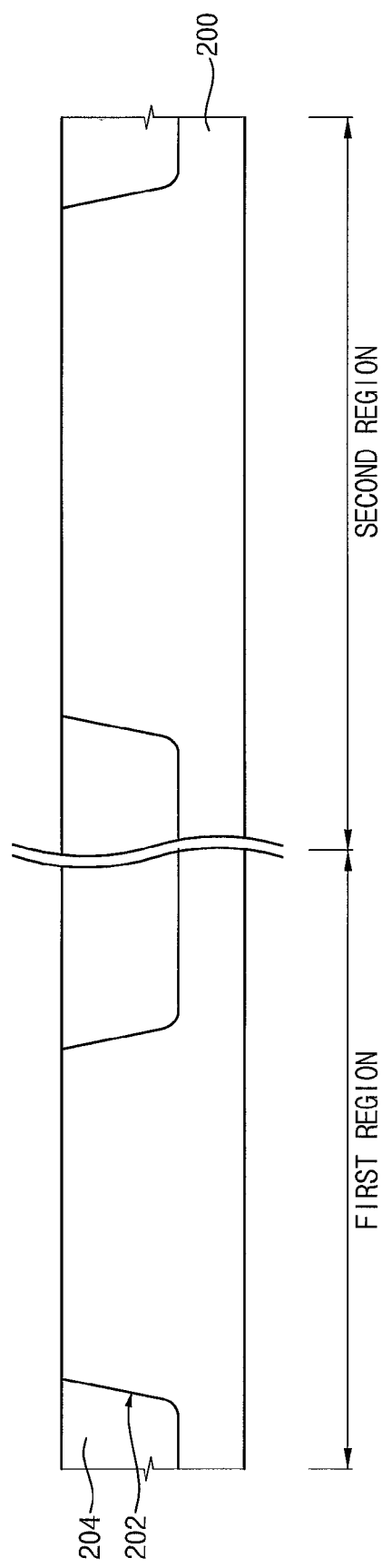
FIGS. 15 to 23 are cross-sectional views illustrating a method of manufacturing the semiconductor device shown in FIG. 14.

Referring to FIG. 15, a pad oxide layer (not shown) and a silicon nitride layer (not shown) are sequentially formed on the substrate 200. The pad oxide layer and the silicon nitride layer are patterned by a photolithography process to form a hard mask pattern (not shown). The hard mask pattern covers a portion of the substrate 200 corresponding to an active region.

The substrate 200 is etched using the hard mask pattern as an etching mask to form isolation trenches 202. An isolation layer (not shown) is formed on the substrate 200 to fill the isolation trenches 202. The isolation layer is polished to form isolation layer pattern 204 in the isolation trenches 202. The hard mask pattern is then removed.

Figure 16:
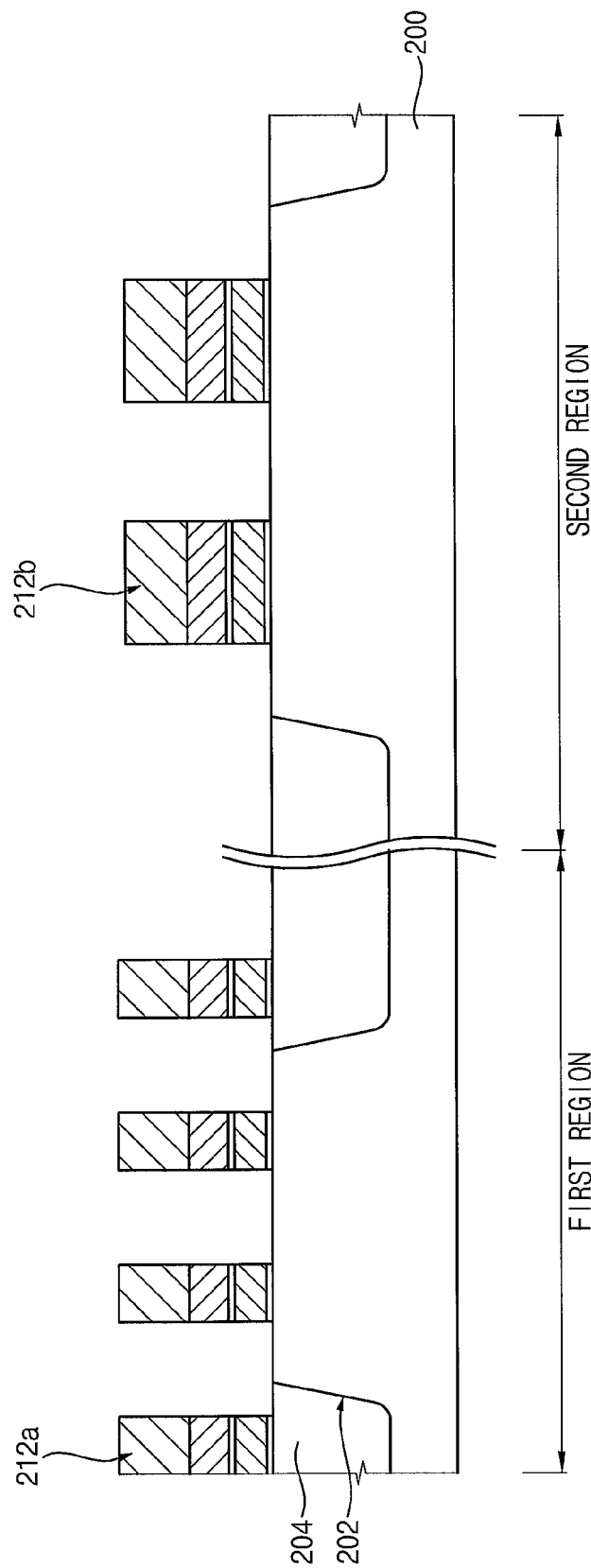

In this part of the method, most of the hard mask pattern is removed during the etching process and the polishing process. Thus, an upper surface of the substrate 200 is substantially coplanar with that of the isolation layer pattern 204 in the active region. Referring to FIG. 16, the first gate structures 212a and the second gate structures 212b are formed on the substrate 200. In this embodiment, the first gate structures 212a and the second gate structures 212b are formed by processes substantially the same as those illustrated in and described with reference to FIG. 2.

Figure 24:
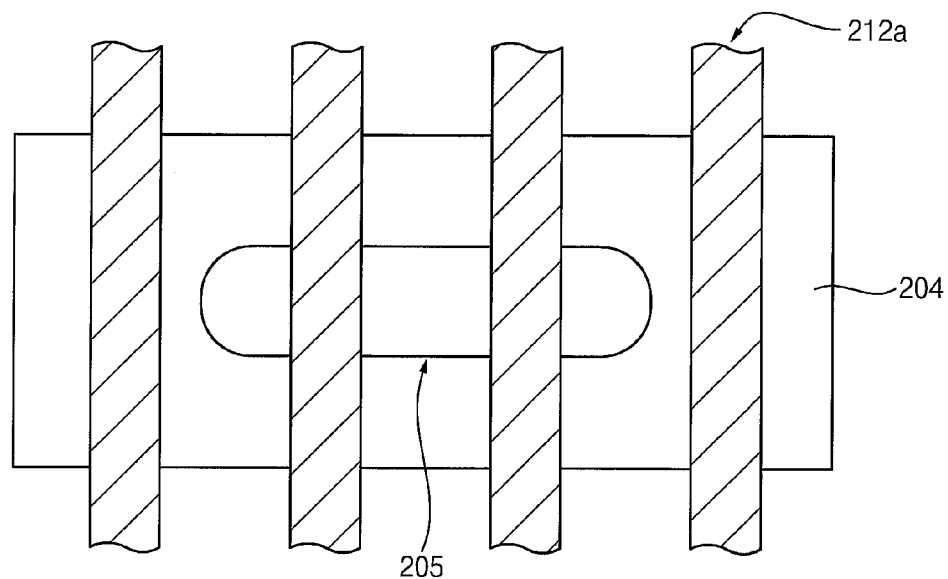
FIG. 24 is a plan view of first gate structures in a first region of a semiconductor substrate.

FIG. 24 illustrates the first gate structures on the first region of the substrate. The first gate structures 212a extend parallel to each other. Furthermore, the first gate structures 212a are regularly spaced apart from each other, and the first gate structures 212a all have the same width.

Figure 17:
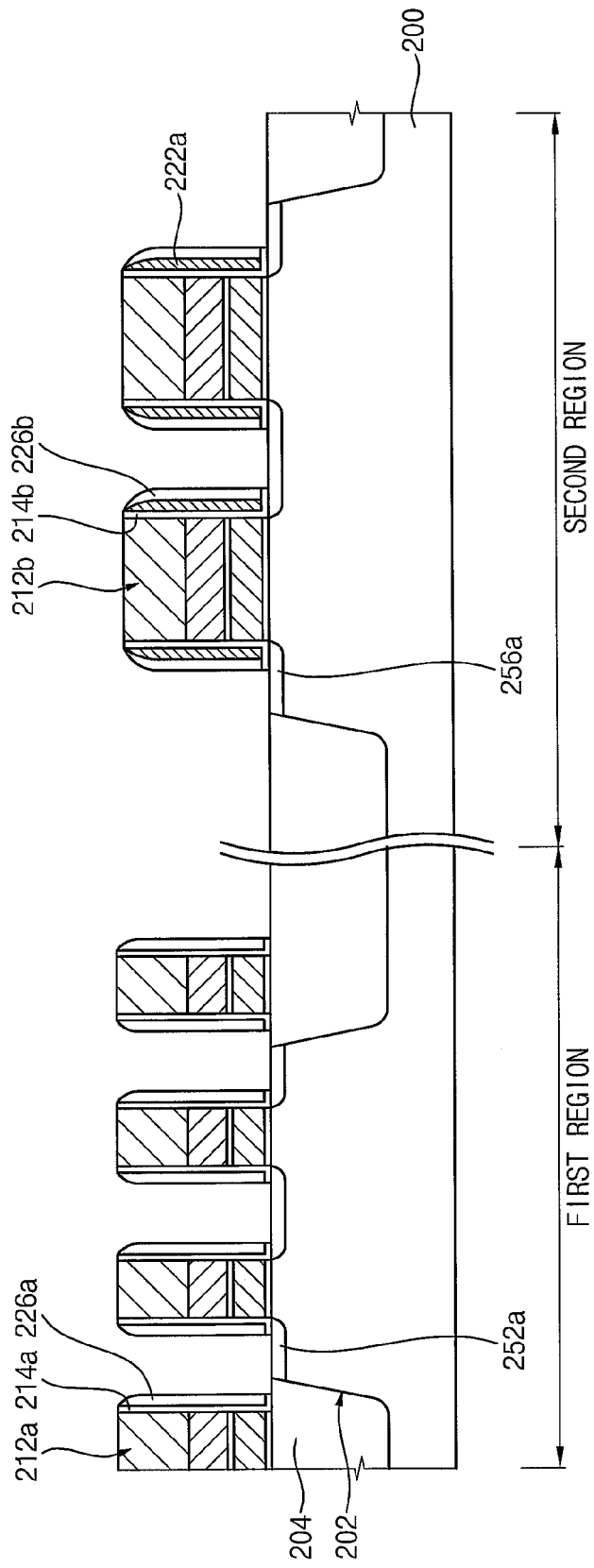

Referring to FIG. 17, processes substantially the same as those illustrated in and described with reference to FIGS. 3 to 8 are performed to form the first lightly doped impurity regions 252a in the substrate 200 at the sides of the first gate structures, and the second lightly doped impurity regions 256a in the substrate 200 at the sides of the second gate structures 212b. Furthermore, the first capping layer pattern 214a and the third spacers 226a are formed on the side faces of the first gate structures 212a. The second capping layer pattern 214b, the first spacers 222a and the second spacers 226b are formed on the side faces of the second gate structures 212b.

Figure 18:
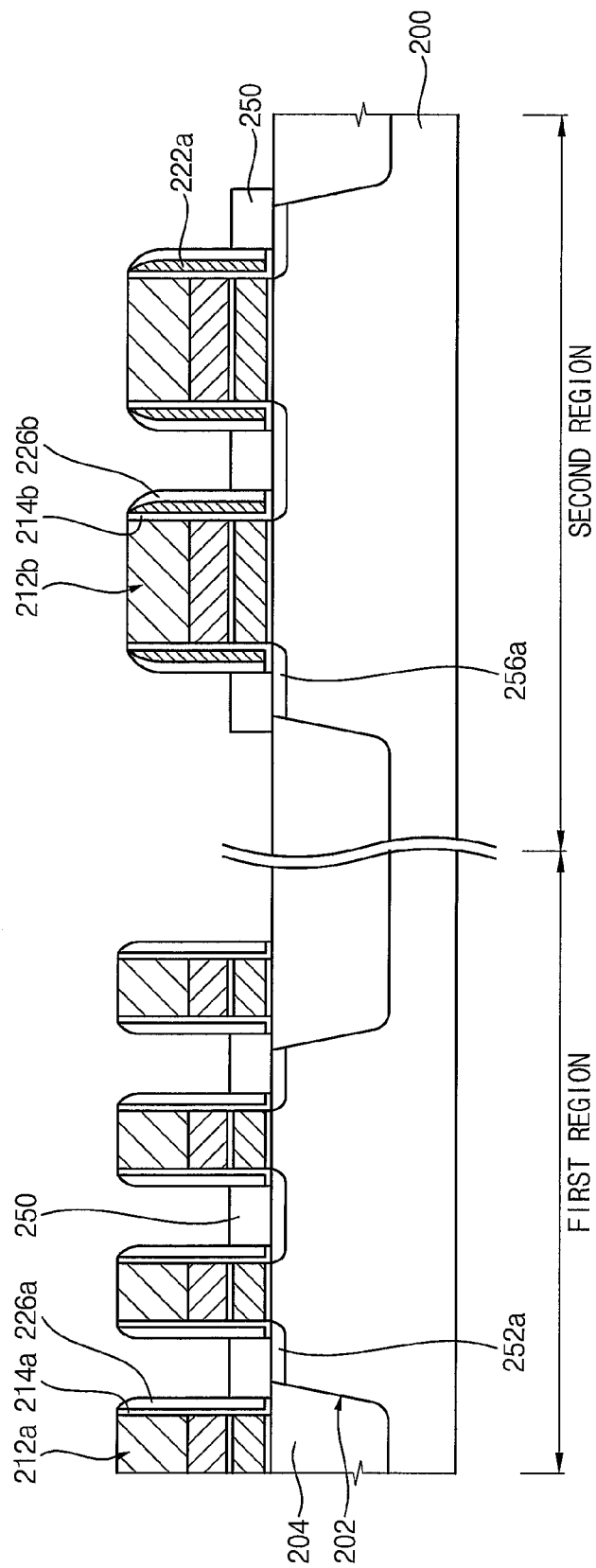

Referring to FIG. 18, the single crystalline silicon layer pattern 250 is formed on upper surfaces of the substrate 200 and the isolation layer pattern 204 exposed by the second spacers 226b and the third spacers 226a. In this embodiment, the single crystalline silicon layer pattern 250 is formed by a selective epitaxial growth (SEG) process using the exposed substrate 200 as a seed layer.

Figure 25:
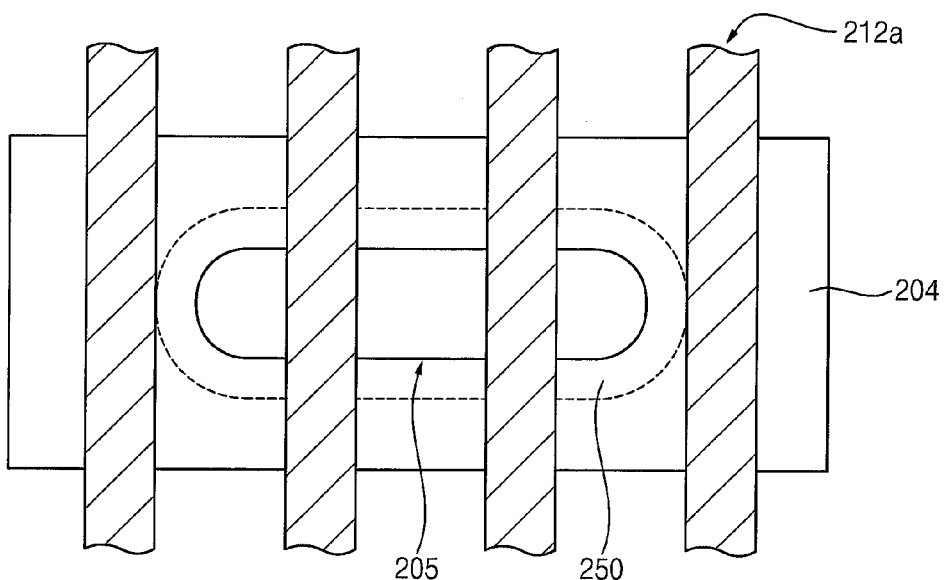
FIG. 25 is a plan view of a single crystalline silicon layer pattern on the first region of the semiconductor substrate.

In the SEG process, a single crystalline silicon layer is initially grown from the upper surface of the substrate 200 along of the upper surface of the exposed substrate 200. An additional single crystalline silicon layer will also grow laterally, i.e., from the sides of, the single crystalline silicon layer initially grown from the upper surface of the substrate 200. Thus, the single crystalline silicon layer pattern 250 can be formed along the edges of the upper surface of the isolation layer pattern 204 as well as on the exposed substrate 200. FIG. 25 shows the shape of single crystalline silicon layer pattern 250 on the first region of the substrate. As shown best in FIG. 25, the single crystalline silicon layer pattern 250 projects from the active region 205 onto part of the isolation layer pattern 204.

Figure 19:
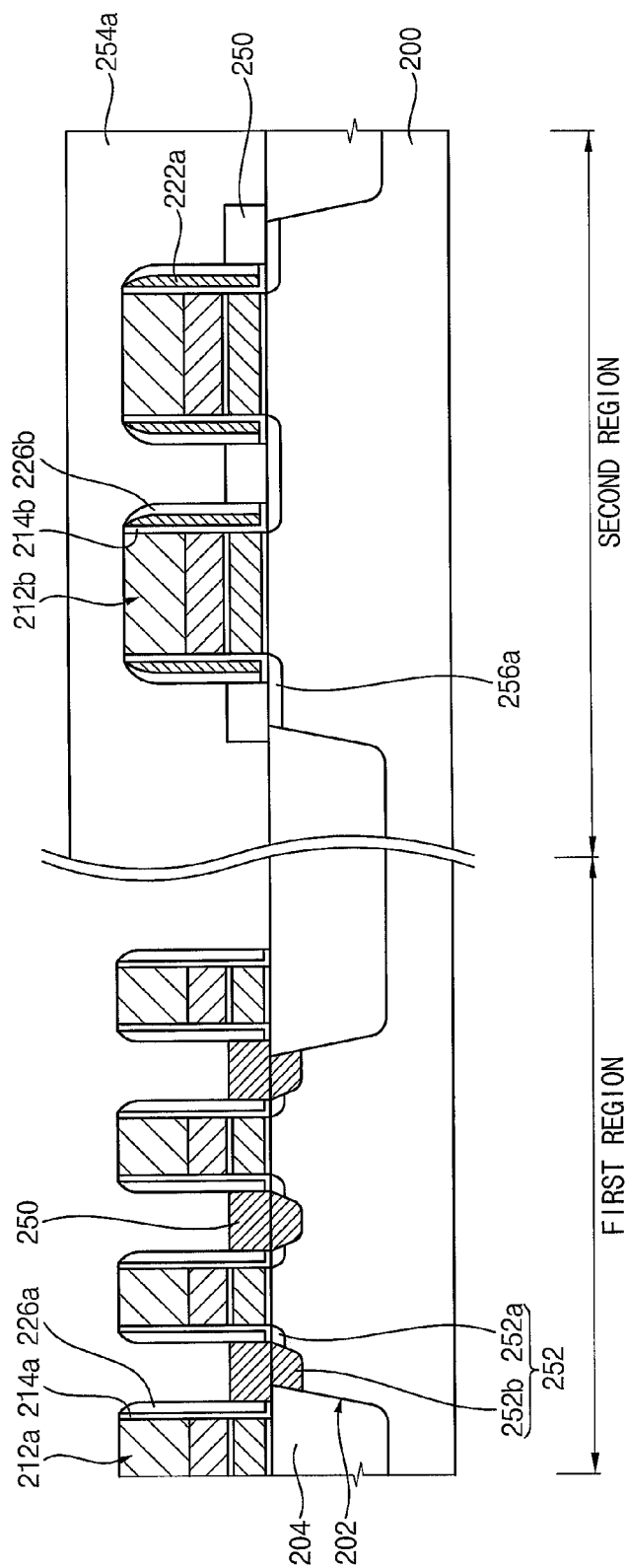

Referring to FIG. 19, a photoresist film (not shown) is formed on the single crystalline silicon layer pattern 250, the first gate structures 212a and the second gate structures 212b so as to cover the first gate structures 212a and the second gate structures 212b. The photoresist film is exposed, developed and baked to form a first photoresist pattern 254a for masking the second region.

Impurities are implanted into the first region using the first photoresist pattern 254a as an ion implantation mask to form the first heavily doped impurity regions 252b. Furthermore, the single crystalline silicon layer pattern 250 on the first region and a portion of the substrate 200 under the single crystalline silicon layer pattern 250 are doped with the impurities. Thus, the first heavily doped impurity regions 252b each include a portion of the substrate 200 between the third spacers 226a and the single crystalline silicon layer pattern 250. That is, each of the first heavily doped impurity regions 252b has an upper surface substantially corresponding to that of the single crystalline silicon layer pattern 250.

Therefore, although the impurities are implanted using high energy, the impurities do not diffuse excessively in the substrate 200 under the first gate structures 212a. As a result, the cell transistors do not suffer from short channel effects.

Although not depicted in drawings, the first photoresist pattern 254a is then removed by an ashing process and/or a stripping process.

Figure 20:
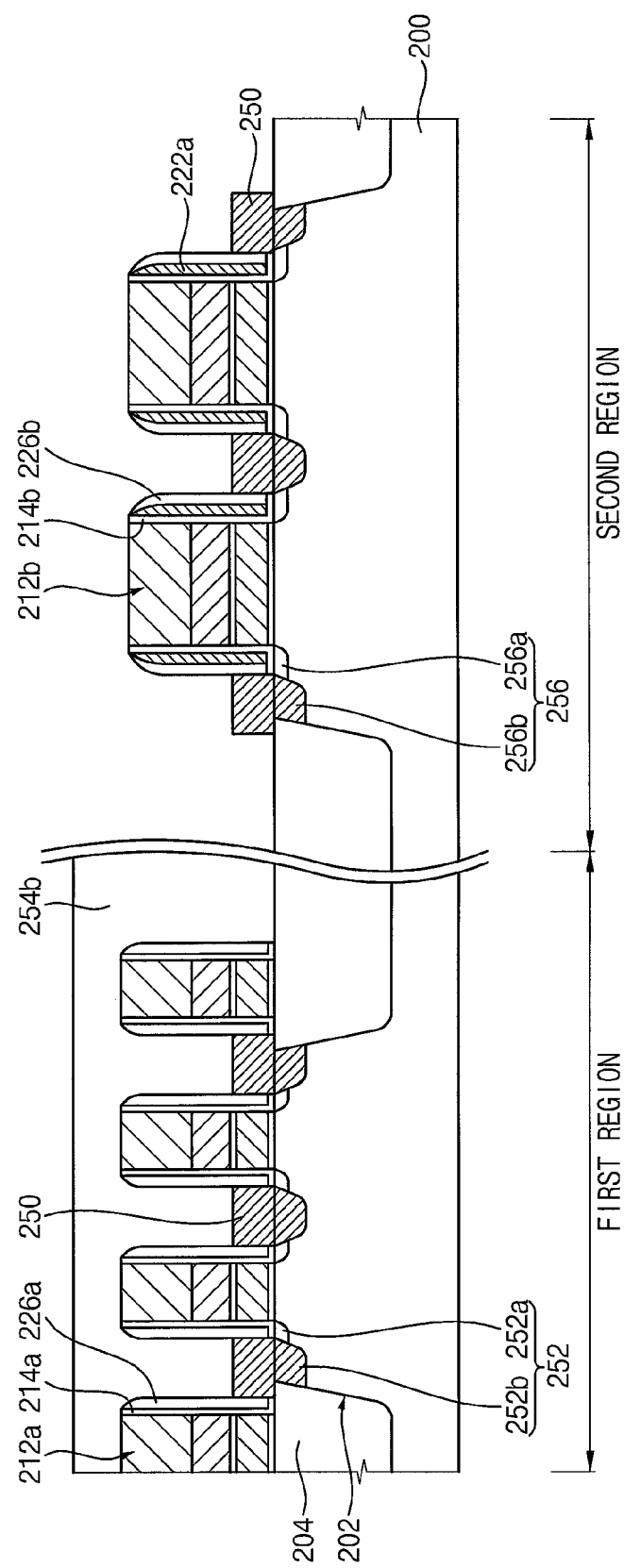

Referring to FIG. 20, a photoresist film (not shown) is formed on the single crystalline silicon layer pattern 250, the first gate structures 212a and the second gate structures 212b to cover the first gate structures 212a and the second gate structures 212b. The photoresist film is exposed, developed and baked to form a second photoresist pattern 254b which masks the first region.

Impurities are implanted into the second region using the second photoresist pattern 254b as an ion implantation mask to form the second heavily doped impurity region 256b.

Here, those portions of the single crystalline silicon layer pattern 250 in the second region and corresponding portions of the substrate 200 under the single crystalline silicon layer pattern 250 are doped with the impurities. Thus, the second heavily doped impurity regions 256b include portions of the substrate 200 to the sides of the second spacers 226b and the single crystalline silicon layer pattern 250. That is, each second heavily doped impurity region 256b has an upper surface substantially corresponding to that of the single crystalline silicon layer pattern 250.

Although, again, the impurities are implanted using high energy, the impurities do not excessively diffuse in the substrate 200 under the second gate structures 212b. Furthermore, the sidewall spacers on the sides of the second gate structures 212b are relatively wide because they include both a first spacer 222a and a second spacer 226b. Therefore, the sidewall spacers all suppress the diffusion of impurities laterally under the second gate structures 212b. That is, the sidewall spacers obviate short channel effects.

Although not depicted in drawings, the second photoresist pattern 254b is then removed by an ashing process and/or a stripping process.

Figure 21:
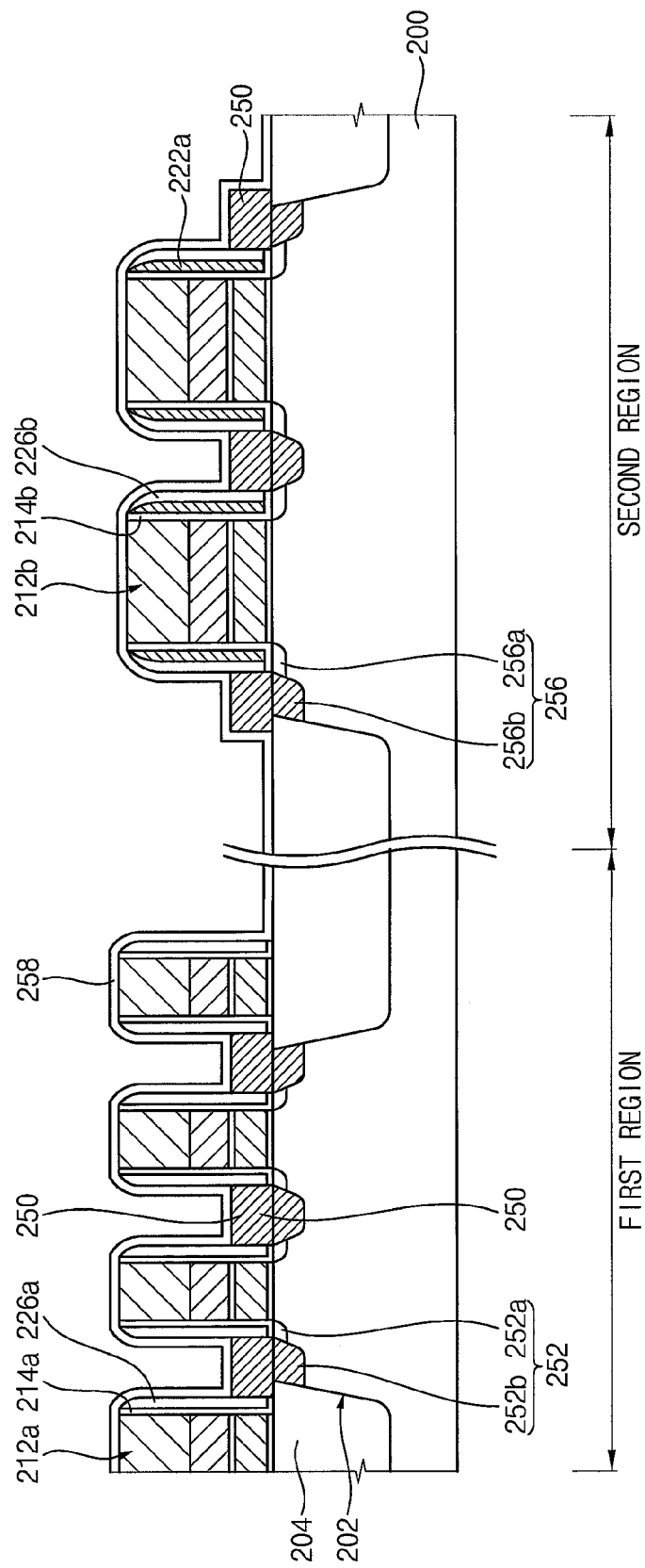

Referring to FIG. 21, an etch-stop layer 258 is formed on the single crystalline silicon layer pattern 250, the second spacers 226b, the third spacers 226a, the first gate structures 212a and the second structures 212b. In this embodiment, the etch-stop layer 258 is a layer of silicon nitride formed by CVD. Preferably, the etch-stop layer 258 has a thickness of about 100 to 300 Å. When the thickness of the etch-stop layer 258 were below about 100 Å, the etch-stop layer 258 could be completely removed while an insulation interlayer is etched to form contact holes, i.e., the etch-stop layer would not sufficiently ensure that underlying structures were protected. On the other hand, when the thickness of the etch-stop layer 258 were above about 300 Å, not all of the etch-stop layer 258 would be readily removed once the contact holes were formed.

Figure 22:
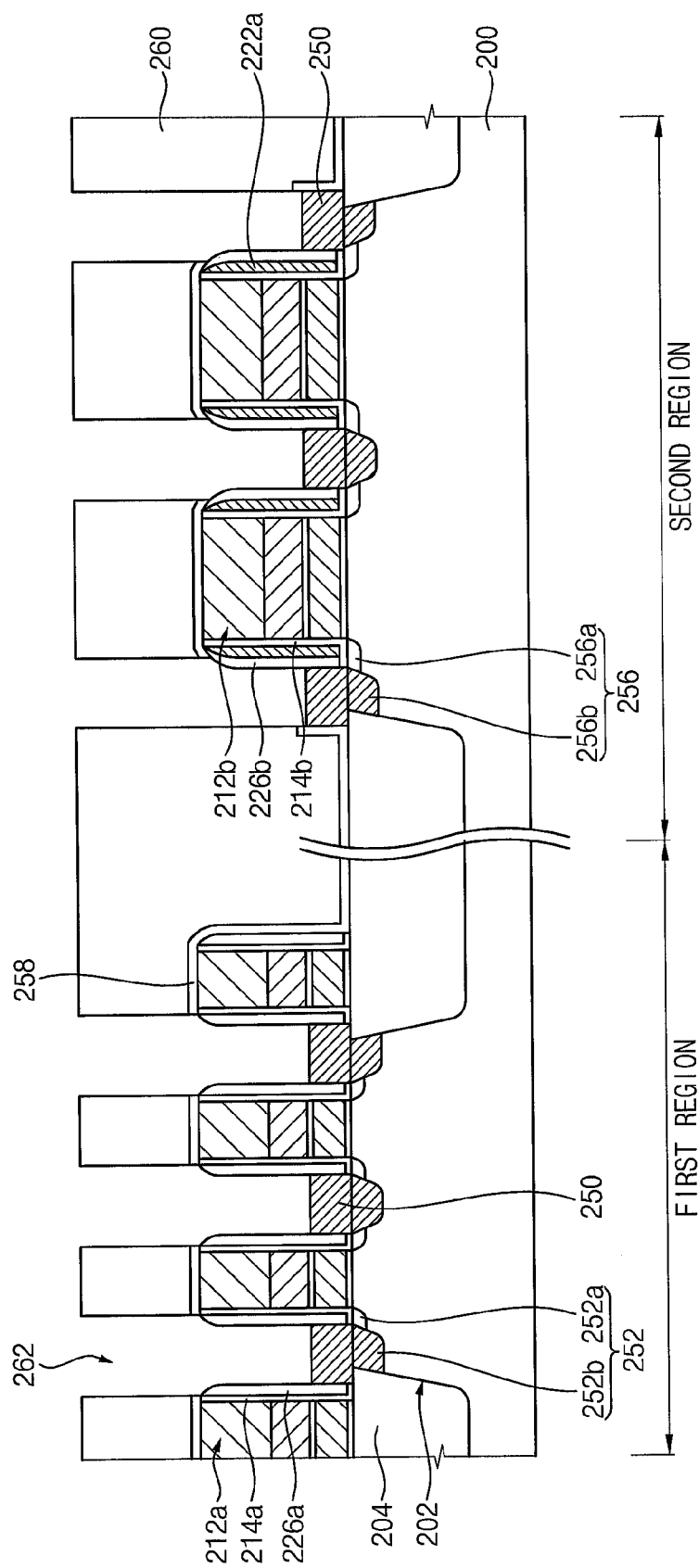

Referring to FIG. 22, an insulation interlayer 260 is formed on the substrate 200 to fill interstices between the first gate structures 212a and between the second gate structures 212b. In this embodiment, the insulation interlayer 260 is a layer of silicon oxide formed by CVD. Additionally, the insulation interlayer 260 may be planarized by a chemical mechanical polishing (CMP) process.

A photoresist pattern (not shown) is formed on the insulation interlayer 260. The photoresist pattern has openings aligned with the regions between the first gate structures 212a. Alternatively, the photoresist pattern has openings aligned with regions between the first gate structures 212a, and regions between the second gate structures 212b.

The insulation interlayer 260 is etched using the photoresist pattern as an etching mask to form self-aligned contact holes 262 exposing the upper surface of the single crystalline silicon layer pattern 250. In this embodiment, the self-aligned contact holes 262 are formed between the first gate structures 212a and between the second gate structures 212b. (Alternatively, the self-aligned contact holes 262 may be formed only between the first gate structures 212a).

Figure 23:
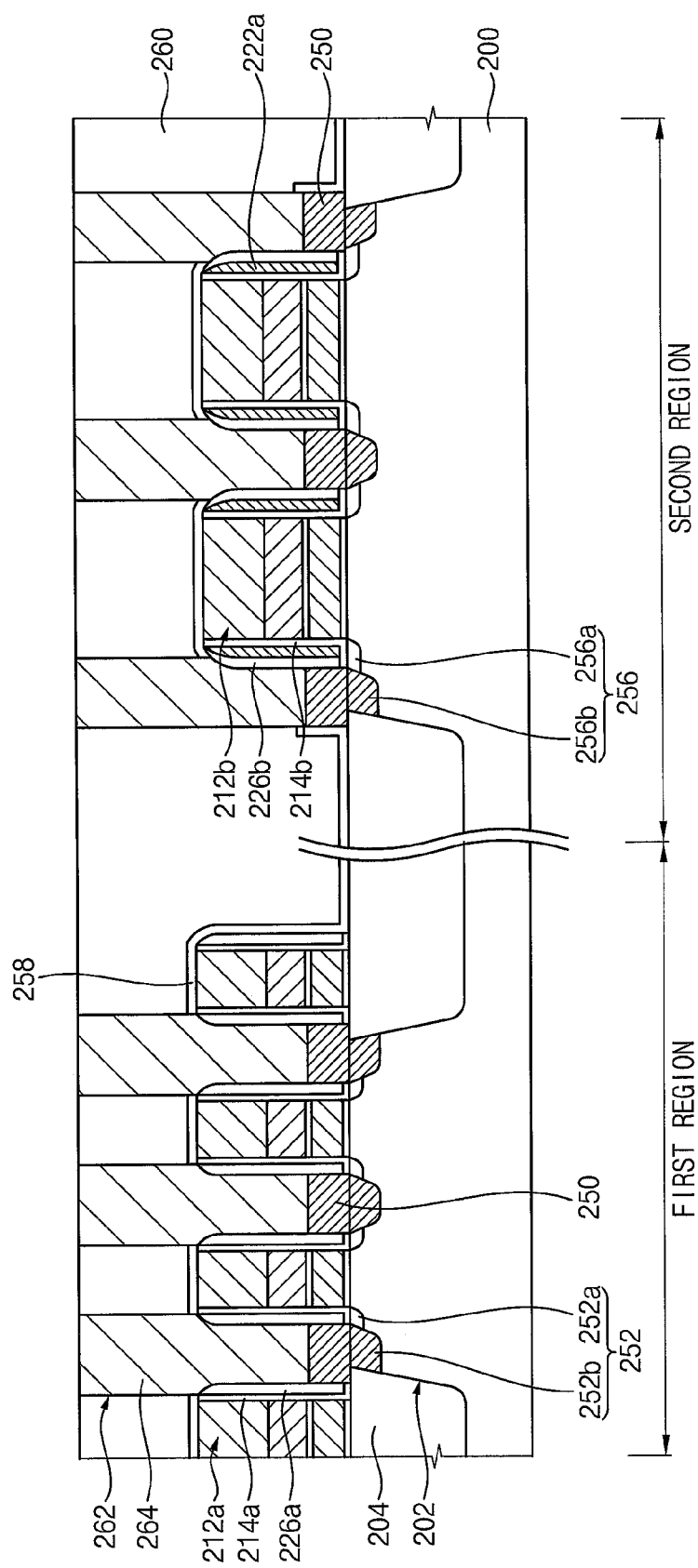

Referring to FIG. 23, a conductive layer (not shown) is formed on the insulation interlayer 260 to fill the self-aligned contact holes 262. The conductive layer is polished to form contact plugs 264 which contact the first impurity regions 252 and the second impurity regions 256.

The contact plugs 264 are shorter than conventional contact plugs because the contact plugs 264 only need to extend to the upper surface of the single crystalline silicon layer pattern 250. Thus, the present invention makes it easier to form the contact holes 262 and the conductive layer. Furthermore, as described above, the single crystalline silicon layer pattern 250 extends onto margins of the isolation layer pattern 204. Thus, the contact plugs 264 may have relatively large lower surfaces, i.e., that area of contact between a contact plug and a source/drain region is larger than in corresponding conventional semiconductor devices. Thus, the contact plugs 264 have less contact resistance than in corresponding conventional semiconductor devices.

According to the present invention as described above, a semiconductor device including transistors, which may have different electrical characteristics and different sizes, may be manufactured by simple processes. Moreover, the cell transistors, despite having short channels and a small spacing, nonetheless have an increased operating current and a fast operating speed due to minimal contact resistance between contact plugs and the source/drain regions. Furthermore, short channel effects are suppressed in the relatively wide peripheral transistors. As a result, a semiconductor device according to the present invention has excellent operating characteristics and reliability.

The foregoing is illustrative of the present invention and is not to be construed as limiting thereof. Although the present invention have been described in connection with the preferred embodiments thereof, those skilled in the art will readily appreciate that the preferred embodiments can be modified without materially departing from the spirit of the invention. Accordingly, the present invention is not limited to the specific embodiments disclosed, but by the scope of the appended claims.

What is claimed is:

1. A method of manufacturing a semiconductor device, comprising:
    forming first gate structures spaced apart from each other by regular intervals on a first region of a substrate, and forming second gate structures spaced apart from each by regular intervals other on a second region of the substrate, the intervals by which the second gate structures are spaced apart from each other being greater than the intervals by which the first gate structures are spaced apart from each other, respectively;
    forming a capping layer on the first gate structures, the second gate structures and the substrate so as to cover opposite side surfaces of each of the gates structures;
    forming over the capping layer a first spacer and a second spacer on each of the side faces of the second gate structures, and a third spacer on the side faces of each of the first gate structures, the first spacers comprising a first insulation material, and the second spacers and the third spacers each comprising an insulation material different from the first insulation material;
    etching the capping layer to form a first capping layer pattern on the side faces of the first gate structures and a second capping layer pattern on the side faces of the second gate structures;
    doping the substrate with impurities on opposite sides of the first gate structures to form first impurity regions in the first region of the substrate; and
    doping the substrate with impurities on opposite sides of the second gate structures to form second impurity regions in the second region of the substrate.

2. The method of claim 1, wherein each of the first gate structures is narrower than each of the second gate structures.

3. The method of claim 1, wherein the forming of the first spacers, the second spacers and the third spacers comprises:
    forming the first spacers on the side faces of the second gate structures; and
    subsequently forming the second spacers on the first spacers and the third spacers on the side faces of the first gate structures.

4. The method of claim 3, wherein the forming of the first spacers comprises:
    forming a first insulation layer on the first gate structures, the second gate structures and the capping layer;
    anisotropically etching the first insulation layer to form preliminary spacers on the side faces of the first gate structures and the second gate structures; and
    removing the preliminary spacers from the first gate structures.

5. The method of claim 1, wherein forming the first spacers, the second spacers and the third spacers comprises:
    forming a first insulation layer pattern comprising the first insulation material on the second region of the substrate and the second gate structures;
    forming a second insulation layer comprising the second insulation material on the capping layer and the first insulation layer pattern;
    anisotropically etching the second insulation layer to form the second spacers and the third spacers; and
    anisotropically etching the first insulation layer pattern to form the first spacers.

6. The method of claim 1, wherein the doping comprises doping the substrate with different concentrations of impurities and to different depths in the first and second regions such that the first impurity regions have different impurity concentrations and different depths than the second impurity regions.

7. The method of claim 1, further comprising:
    etching the first region and the second region of the substrate, before the first gate structures and the second gate structures are formed, to form isolation trenches defining active regions which each have the shape of an island shape; and
    filling the isolation trench with insulation material to form an isolation layer pattern.

8. The method of claim 7, further comprising:
    growing single crystalline silicon from an upper surface of the substrate exposed, after the first capping layer pattern and the second capping layer pattern are formed, to form a single crystalline silicon layer pattern covering part of the upper surface of the isolation layer pattern.

9. The method of claim 8, wherein the doping of the substrate with impurities on opposite sides of the first gate structures comprises doping the single crystalline silicon layer pattern on the first region with impurities.

10. The method of claim 8, wherein the doping of the substrate with impurities on opposite sides of the second gate structures comprises doping the single crystalline silicon layer pattern on the second region with impurities.

11. The method of claim 8, further comprising:
    covering the first gate structures, the second gate structures and the single crystalline silicon layer pattern with an insulation interlayer, after the first impurity regions and the second impurity regions are formed;
    etching the insulation interlayer to form a contact hole exposing an upper surface of the single crystalline silicon layer pattern; and
    filling the contact hole with conductive material to form a contact plug.

12. The method of claim 11, further comprising:
    forming an etch-stop layer on the first gate structures, the second gate structures and the single crystalline silicon layer, before the insulation interlayer is formed.

13. The method of claim 1, wherein the capping layer comprises silicon nitride or silicon oxynitride.

14. The method of claim 1, wherein the first insulation material comprises silicon oxide, and the second insulation material comprises silicon nitride.

15. A semiconductor device comprising:
- a substrate having a first region and a second region;
- first gate structures arranged on the first region of the substrate, the first gate structures being spaced apart from each other by regular intervals;
- second gate structures arranged on the second region of the substrate, the second gate structures being spaced apart from each other by regular intervals greater than the intervals by which the first gate structures are spaced apart from each other, respectively;
- a first capping layer pattern having segments extending along side faces of the first gate structures and having segments extending along the upper surface of the substrate;
- a second capping layer pattern having segments extending along side faces of the second gate structures and segments extending along the upper surface of the substrate;
- first spacers arranged on the second capping layer pattern, the first spacers comprising a first insulation material; and
- second spacers arranged on the first spacers, the second spacers comprising a second insulation material different from the first insulation material, and wherein the substrate has
- first doped regions at opposite sides of the first gate structures and which constitute first impurity regions in the first region of the substrate; and
- second doped regions at opposite sides of the second gate structures and which constitute second impurity regions in the second region of the substrate.

16. The semiconductor device of claim 15, wherein the first spacers each cover part of a segment of the second capping layer pattern which extends along the upper surface of the substrate.

17. The semiconductor device of claim 15, wherein the bottom of each of the second spacers contacts an end of a segment of the second capping layer pattern which extends along the upper surface of the substrate.

18. The semiconductor device of claim 15, wherein each of the first spacers has a bent portion adjacent to an interface between a side face of one of the second gate structures and the upper surface of the substrate.

19. The semiconductor device of claim 15, wherein each of the first gate structures is narrower than each of the second gate structures.

20. The semiconductor device of claim 15, wherein the first impurity regions and the second impurity regions have different impurity concentrations and different depths.

21. The semiconductor device of claim 15, further comprising an isolation layer pattern in the first and second regions of the substrate, the isolation layer pattern delimiting active regions of the substrate, each of the active regions having the shape of an island.

22. The semiconductor device of claim 21, further comprising a single crystalline silicon layer pattern on the active regions of the substrate, the single crystalline silicon layer pattern extending between the first gate structures the first impurity regions, between the second gate structures, and over the upper surface of the isolation layer pattern.

23. The semiconductor device of claim 22, wherein the single crystalline silicon layer pattern is doped with impurities and is electrically conductively connected to the first impurity regions and the second impurity regions.

24. The semiconductor device of claim 22, further comprising an etch-stop layer arranged on the first gate structures, the second gate structures and the single crystalline silicon layer pattern.

25. The semiconductor device of claim 22, further comprising:
- an insulation interlayer covering the first gate structures, the second gate structures and the single crystalline silicon layer pattern; and
- a contact plug extending through the insulation interlayer and contacting an upper surface of the single crystalline silicon layer pattern.

* * * * *